(12) United States Patent
Baumann et al.

(10) Patent No.: US 7,858,292 B2
(45) Date of Patent: Dec. 28, 2010

(54) IMAGEABLE ELEMENTS WITH COMPONENTS HAVING 1H-TETRAZOLE GROUPS

(75) Inventors: Harald Baumann, Osterode/Harz (DE); Udo Dwars, Herzberg/Harz (DE); Bernd Strehmel, Berlin (DE); Christopher D. Simpson, Osterode (DE); Celin Savariar-Hauck, Badenhausen (DE); Gerhard Hauck, Badenhausen (DE)

(73) Assignee: Eastman Kodak Company, Rochester, NY (US)

( * ) Notice: Subject to any disclaimer, the term of this patent is extended or adjusted under 35 U.S.C. 154(b) by 442 days.

(21) Appl. No.: 11/949,810

(22) Filed: Dec. 4, 2007

(65) Prior Publication Data

US 2009/0142695 A1 Jun. 4, 2009

(51) Int. Cl.
*G03F 7/004* (2006.01)
*G03F 7/30* (2006.01)

(52) U.S. Cl. ............... 430/302; 430/270.1; 430/281.1; 430/920

(58) Field of Classification Search ............. 430/270.1, 430/281.1, 302, 920
See application file for complete search history.

(56) References Cited

U.S. PATENT DOCUMENTS

| | | | |
|---|---|---|---|
| 4,511,645 A | 4/1985 | Koike et al. | |
| 4,629,679 A * | 12/1986 | Uchida et al. | 430/281.1 |
| 5,240,811 A * | 8/1993 | Taylor et al. | 430/270.1 |

FOREIGN PATENT DOCUMENTS

| | | |
|---|---|---|
| EP | 924 570 A1 | 6/1999 |
| JP | 61-204631 | 10/1986 |
| WO | 2004/035687 | 4/2004 |
| WO | 2004/074930 | 9/2004 |
| WO | 2007/090550 | 8/2007 |
| WO | WO 2007/099053 | 9/2007 |

OTHER PUBLICATIONS

Taden et al., "Synthesis and Polymerization of 5-(Methacrylamido)tetrazole, a Water-Soluble Acidic Monomer", *Journal of Polymer Science: Part A*, vol. 40, 2002, pp. 4333-4343.
Rita Darkow et al, "Synthesis, photomodification and characterization of homo- and copolymers with 2,5-bisaryltetrazolyl pendant groups", *Reactive & Functional Polymers* 32 (1997) 195-207.

* cited by examiner

*Primary Examiner*—John S Chu
(74) *Attorney, Agent, or Firm*—J. Lanny Tucker

(57) ABSTRACT

Radiation-sensitive compositions and imageable elements include a polymeric or non-polymeric component in an imageable layer, which component includes 1H-tetrazole groups. The non-polymeric components can be radically polymerizable compounds. The polymeric components can have 1H-tetrazole groups that are pendant to the backbone. The use of such components in negative- or positive-working imageable elements provides high photospeed and improved developability for providing imaged and developed elements, such as lithographic printing plates that show improved chemical resistance and run length.

24 Claims, No Drawings

US 7,858,292 B2

IMAGEABLE ELEMENTS WITH COMPONENTS HAVING 1H-TETRAZOLE GROUPS

FIELD OF THE INVENTION

This invention relates to radiation-sensitive compositions and imageable elements including both negative- and positive-working imageable elements that can be used to prepare lithographic printing plates. The imageable elements contain certain polymeric and non-polymeric components that have pendant 1H-tetrazole groups. The invention also relates to methods of imaging and processing these imageable elements.

BACKGROUND OF THE INVENTION

Radiation-sensitive compositions are routinely used in the preparation of imageable materials including lithographic printing plate precursors. Such compositions generally include a radiation absorbing compound or sensitizer, a binder, and in some instances initiator compositions and polymerizable components, each of which has been the focus of research to provide various improvements in physical properties, imaging performance, and image characteristics.

Recent developments in the field of printing plate precursors concern the use of radiation-sensitive compositions that can be imaged by means of lasers or laser diodes. Laser exposure does not require conventional silver halide graphic arts films as intermediate information carriers (or "masks") since the lasers can be controlled directly by computers. High-performance lasers or laser-diodes that are used in commercially-available image-setters generally emit radiation in a specific region of the electromagnetic spectrum, and thus the radiation-sensitive compositions are required to be sensitive in the regions appropriate for a specific imaging laser.

Radiation-sensitive compositions and the imageable elements in which they incorporated are generally either negative-working or positive-working. For negative-working imageable elements, exposed regions in the radiation-sensitive compositions are hardened and non-exposed regions are usually washed off during development. For positive-working imageable elements, the exposed regions are dissolved in a developer and the non-exposed regions become an image.

The literature that describes various components of such imageable elements includes hundreds of publications, and thus they are too numerous to mention here. The patent literature is full of teaching relating to various problems that the industry has been addressing for the last several decades, especially as the "computer-to-plate" (CTP) imageable elements and equipment became prominent in the 1990's. Thus, there has been considerable efforts to develop both positive- and negative-working elements with high imaging sensitivity (high photospeed), fast developability in various developing solutions (generally alkaline in pH), high resistance to degradation to pressroom chemicals ("chemical resistance"), plate durability, storage stability, high image stability, low environmental impact, and high run length.

Some of these problems have been solved by designing unique polymeric binders that are used in imageable layers to provide a matrix for the various imaging components. For example, U.S. Pat. No. 4,511,645 (Kioke et al.) describes the use of polymeric binders having unsaturated side chains in negative-working imageable elements to stabilize image formation. In addition, EP 0 924 570A1 (Fujimaki et al.) describes UV/visible-sensitive compositions and imageable elements containing polymeric binders having amido groups in side chains to increase alkaline solution solubility.

WO 2004/074930 (Baumann et al.) describes the use of polymeric binders having carboxylic acid side groups in combination with oxazole derivatives in UV-sensitive negative-working imageable elements. Such polymeric binders are also used with benzoxazole derivatives in UV-sensitive negative-working imageable elements, as described for example, in WO 2007/090550 (Strehmel et al.).

WO 2004/035687 (Loccufier et al.) describes the use of phenolic polymeric binders in positive- or negative-working imageable elements, which polymeric binders include a thio-linked heterocyclic group attached to the phenolic recurring units in order to increase the chemical resistance of the imageable layers. The heterocyclic groups can be any of a wide variety of sulfur, oxygen, or nitrogen-containing heterocyclic groups.

PROBLEM TO BE SOLVED

Despite the advances in lithography, there is a continuing need to improve the chemical resistance, developability, run length, and photospeed of imageable elements that are useful for providing lithographic printing plates.

SUMMARY OF THE INVENTION

The present invention provides an imageable element comprising a substrate having thereon an imageable layer that includes a water-insoluble and alkaline solution-soluble component that has 1H-tetrazole groups, provided that when the component is a phenolic polymer having 1H-tetrazole groups attached thereto, such attachment is provided without a thio linking group.

For example, some embodiments of these imageable elements are negative-working imageable elements in which the component having 1H-tetrazole groups is a non-polymeric radically polymerizable compound or a polymer having pendant 1H-tetrazole groups, or both types of components are present.

In some specific embodiments, the imageable element of this invention is a negative-working imageable element in which the imageable layer comprises:

a radically polymerizable component, an initiator composition capable of generating free radicals sufficient to initiate polymerization of free radically polymerizable groups upon exposure to imaging radiation, a radiation absorbing compound, and a polymer having a backbone to which are attached pendant 1H-tetrazole groups in sufficient amount such that, only prior to exposure to imaging radiation, the imageable layer is soluble in a developer having a pH less than 13.5.

In other embodiments, the imageable element of this invention is a positive-working imageable element comprising at least one imageable layer comprising a polymer having a backbone and pendant 1H-tetrazole groups attached thereto. When the positive-working imageable element has both inner and outer layers, the polymer with the pendant 1H-tetrazole groups can be in either or both of those layers.

The substrate for any of these imageable elements can be an aluminum-containing substrate having a hydrophilic surface upon which the one or more imageable layers are disposed, and the imaged and developed element can be a suitable lithographic printing plate.

This invention also provides a method comprising:

A) imagewise exposing the imageable element of this invention to produce exposed and non-exposed regions, and B) with or without a post-exposure baking step, developing the imagewise exposed element with an aqueous solution having a pH equal to or less than 13.5. Where the imageable element is negative-working, predominantly only the non-exposed regions are removed by development, and where the imageable element is positive-working, predominantly only the exposed regions are removed by development.

The invention further provides a negative-working radiation-sensitive composition comprising:

a radically polymerizable component, an initiator composition capable of generating free radicals sufficient to initiate polymerization of free radically polymerizable groups upon exposure to imaging radiation, a radiation absorbing compound, and a component having 1H-tetrazole groups, which component is:

a) said radically polymerizable component, b) a water-insoluble polymer having pendant 1H-tetrazole groups attached to a backbone in sufficient amount such that, prior to exposure to imaging radiation, the polymer is soluble in a developer having a pH equal to or less than 13.5, or c) both.

With the present invention, imageable elements are provided that exhibit improved chemical resistance, run length, developability, and high photospeed. These imageable elements can be either positive-working or negative-working, and can be designed for spectral sensitivity in the UV, visible, near-IR, or IR regions of the electromagnetic spectrum.

These results are achieved by the presence of a polymeric or non-polymeric component that includes a 1H-tetrazole group that is an acidic group that is soluble in an alkaline solution. It is surprising that both non-polymeric and polymeric components having 1H-tetrazole groups can be used in this invention. In most embodiments, the 1H-tetrazole group is pendant to the backbone of a polymer that can be used in small amounts or in larger amounts as a polymeric binder.

DETAILED DESCRIPTION OF THE INVENTION

Definitions

Unless the context indicates otherwise, when used herein, the terms "radiation-sensitive composition", "imageable element", "lithographic printing plate precursor", and "printing plate precursor" are meant to be references to embodiments of the present invention.

In addition, unless the context indicates otherwise, the various components described herein such as polymeric or non-polymeric "components that has 1H-tetrazole groups", "initiator", "co-initiator", "free radically polymerizable component", "radiation absorbing compound", and similar terms also refer to mixtures of such components. Thus, the use of the articles "a", "an", and "the" is not necessarily meant to refer to only a single component.

Moreover, unless otherwise indicated, percentages refer to percents by total dry weight, for example, weight % based on total solids of either an imageable layer or radiation-sensitive composition. Unless otherwise indicated, the percentages can be the same for either the dry imageable layer or the total solids of radiation-sensitive composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers, homopolymers, and copolymers, which are defined for this invention to have a molecular weight of at least 500.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Components with 1H-Tetrazole Groups

The imageable elements have at least one imageable layer (described below) that contains one or more water-insoluble and alkaline solution-soluble components, each of which has 1H-tetrazole groups. In an alkaline solution, the tetrazole groups lose a hydrogen atom at the 1-position, as illustrated in the following Equation (1):

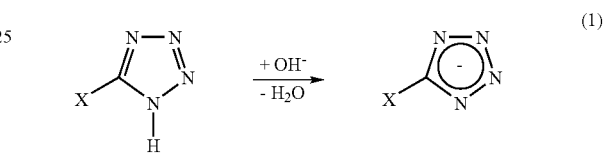

wherein X represents the remainder of a non-polymeric molecule or a linking group connected to a polymer backbone. In many embodiments (but not all), the 1H-tetrazole is connected at its 5-position to a nitrogen atom (that is, X includes a nitrogen atom directly attached to the tetrazole ring).

The components with the 1H-tetrazole groups can be non-polymeric meaning that they have a molecular weight generally less than 500. Useful non-polymeric components with 1H-tetrazole groups can be ethylenically unsaturated polymerizable compounds, for example, monomers that can be polymerized or incorporated with other co-monomers into copolymers. Each of such compounds contains one or more free radically polymerizable groups that can be polymerized in the presence of free radicals. These polymerizable compounds can have multiple free radically polymerizable groups as well as one or more 1H-tetrazole groups.

Table A below contains examples of non-polymeric compounds having acidic 1H-tetrazole groups. Such non-polymeric compounds can be prepared by acylation ($A_1$) of 1H-tetrazole-5-amine with acid halogenides of ethylenically unsaturated carboxylic acids (for example, methacrylic acid chloride and acrylic acid chloride) or acid anhydrides of ethylenically unsaturated carboxylic acid (for example, acrylic acid anhydride and methacrylic acid anhydride). In the case of an ethylenically unsaturated intramolecular acid anhydride like maleic acid anhydride, after addition of the amino group, condensation to an imide is possible ($A_2$). The same amides can be made by amidization of alkylesters of ethylenically unsaturated carboxylic acid, such as methyl methacrylate or methyl acrylate or by the reaction of nitriles of unsaturated carboxylic acid like acrylonitrile or methacrylonitrile with 1H-tetrazole-5-amine ($A_3$). Furthermore, such non-polymeric compounds can be made by alkylation with alkylhalides of ethylenically unsaturated compounds such as 2-halogeno-alkylene acrylate, 2-halogeno-alkylene methacrylate, or chloromethylated styrene ($A_4$). Depending upon the molecular ratio, one or two unsaturated groups can be introduced into one 1H-tetrazole-5-amine. Similar compounds can be made by Michael addition of 1H-tetrazole-5-amine onto bis-, tris, or multifunctional acrylates, wherein only some of the acrylate groups are added onto the amino group of 1H-tetrazole-5-amine ($A_5$). Depending on the functionality of the acrylates and the ratio of acrylate to 1H-tetrazole-5-amine, a reaction product with more unsaturated groups or with more 1H-tetrazole groups can be made. Examples for the precursors of the Michael adducts are acrylates of bis, tris, tetra, penta-, or multifunctional polyols such as ethylene glycol diacrylate, diethylene glycol diacrylate, triethylene glycol diacrylate, tetraethylene glycol diacrylate, pentaerythritol triacrylate, pentaerythritol tetraacrylate, and trimethylolpropane triacrylate. Furthermore, Michael adducts can be made by reaction of 1H-tetrazole-5-amine with bis, tris, or multifunctional urethane (meth)acrylates, for example, a reaction product of 1 mole of a trisisocyanate, like the biuret of hexamethylene diisocyanate, with 3 moles of hydroxyethyl acrylate. Another similar product can be made by the reaction of epoxy compounds having ethylenically unsaturated groups like glycidyl methacrylate, glycidyl acrylate, or dian bis-glycidyl ether adduct of 1 mole of (meth)acrylic acid with 1H-tetrazole-5-amine ($A_6$). Furthermore, non-polymeric compounds having acidic 1H-tetrazole groups can be made by reaction of 1H-tetrazole-5-amine with isocyanates carrying ethylenically unsaturated groups like isocyanato ethyl methacrylate, allyl isocyanate, or isocyanatoethyl acrylate, 2-, 3-, or 4-isocyanatostyrene ($A_7$). Carbonyl compounds having ethylenically unsaturated groups can also be used to make monomeric compounds with 1H-tetrazole groups by reaction with 1H-tetrazole-5-amine ($A_8$). An example for this type of reaction is 2-(methacryloyoxy)ethylacetoacetate.

TABLE A

| Reaction partner for 1H-tetrazole-5-amine | Reaction product |
|---|---|
| <br>wherein X is halogen,<br>—OR′,<br>—OCO—R,<br>R′ is alkyl, R is<br>—CH═C(R″),<br>and R″ is H or methyl | 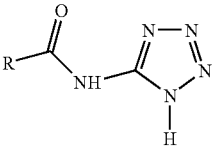<br>$A_1$ |
| 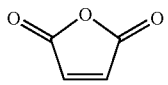 | 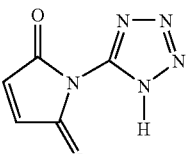<br>$A_2$ |
| $R^8$—C≡N<br>wherein $R^8$ is<br>—CH═C(R″)<br>and R″ is H or methyl | 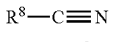<br>$A_3$ |
| $R^1$—X<br>wherein $R^1$ is<br>—CH═C(R″)—COO—X′—R″<br>is H or methyl,<br>X′ is $C_2$-$C_4$ alkylene, X is halogen | 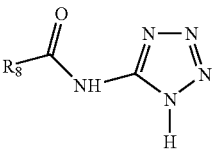 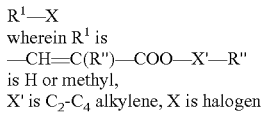<br>$A_4$      $A_4{}'$ |
| 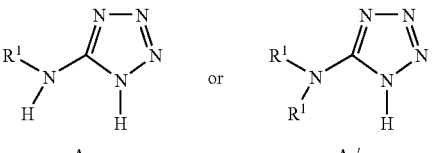<br>wherein $R^4$ is a linear, branched, or cyclic aliphatic residue, n is an integer from 2 to 10 | 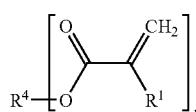<br>m is an integer of from 1 to 9 with the proviso that m < n<br>$A_5$ |

TABLE A-continued

| Reaction partner for 1H-tetrazole-5-amine | Reaction product |
|---|---|
| <br>wherein $R^5$ is a residue having at least 1 ethylenically unsaturated group | 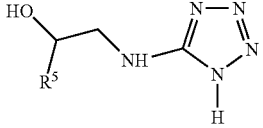<br>$A_6$ |
| $R^3$—NCO<br>wherein $R^3$ is —CH=C(R")—COO—X'—<br>R" is H or methyl,<br>and X' is a $C_2$-$C_4$ alkylene | 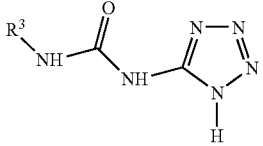<br>$A_7$ |
| 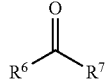<br>wherein $R^6$ is an aliphatic residue having at least one ethylenically unsaturated group, and $R^7$ is an alkyl | 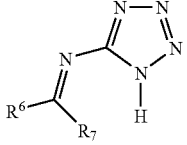<br>$A_8$ |

Non-polymeric, polymerizable components having 1H-tetrazole groups can be used in place of, or in addition to, the radically polymerizable components described below. In most of such embodiments, they are used in combination with other radically polymerizable components that do not contain 1H-tetrazole groups, in any suitable molar ratio.

The described non-polymeric components can be present in an imageable layer generally in an amount of at least 0.2 weight % and up to 90 weight %, and more typically from about 1 to about 60 weight %, based on the total dry weight.

In many other embodiments of this invention, the component having 1H-tetrazole groups is an oligomer or polymer having a backbone to which the 1H-tetrazole groups are attached, rendering the oligomer or polymer soluble in a developer having a pH equal to or less than 13.5. Such oligomers generally have a molecular weight of at least 500 and up to about 2,000, and polymers then generally have an even greater molecular weight of up to about 500,000. More typically, the polymers useful in this invention have a molecular weight of from about 5,000 to about 100,000.

Depending upon the use of the polymer with 1H-tetrazole groups, it is present in a radiation-sensitive composition (or one or more imageable layers) in an amount of at least 5% and up to and including 95% based on the total dry weight. In most embodiments where a polymer is used, it is present in sufficient amount to function as a "polymeric binder", and for example, this would be at least 20% of the total dry weight. The 1H-tetrazole groups are generally present in the noted polymer in an amount sufficient to provide at least 50 mol % and up to 100 mol % of all acidic groups present in the polymer.

Polymers useful in this invention can also be generally represented by the following Structure (I):

-(A)$_x$-(B)$_y$- (I)

wherein A represents recurring units comprising the 1H-tetrazole groups, B represents recurring units not containing 1H-tetrazole groups, x is from about 3 to 100 mol %, and y is from 0 to about 97 mol %. Typically, x is from about 3 to about 90 mol %, y is from about 10 to about 97 mol %, and B represents recurring units derived, for example, from one or more allyl (meth)acrylates, alkyl (meth)acrylates, hydroxyalkyl (meth)acrylates, (meth)acrylamides that can be substituted by alkyl or aryl groups, (meth)acrylates of polyethylene oxide or propylene oxide, (meth)acrylonitriles, styrene or styrene derivatives, vinyl acetate, vinyl carbazole, vinyl pyrrolidone, vinyl alcohol, N-substituted maleimides, or half esters of ring-opened maleic acid anhydrides. Other monomers from which B recurring units can be derived would be readily apparent to a skilled artisan.

A can represent recurring units providing a carbon-carbon backbone derived from one or more ethylenically unsaturated polymerizable monomers, and the 1H-tetrazole groups can be attached to the backbone through a linking group L comprising a —C(=O)—NR$^1$—, —NR$^1$—, —NR$^1$—(C=O)—NR$^2$—, —S—, —OCO(=O)—, or —CH=N— group, or a combination thereof. Particularly useful linking groups include —C(=O)—NR$^1$— and —NR$^1$—(C=O)—NR$^2$—. The noted linking groups can be directly attached to the backbone or attached through an organic group having up to 30 atoms in the linking chain.

The 1H-tetrazole groups can be introduced into polymers in a number of ways. For example, the polymers useful in the present invention can be made by polymerization of Compound A$_1$ to A$_8$ (see TABLE A above) with co-monomers such as those described above for obtaining the B recurring units and others that would be readily apparent to one skilled in the art.

Alternatively, the 1H-tetrazole groups can be introduced into polymers already having reactive functionalities for the amino group in 1H-tetrazole-5-amine. Examples of such reactive polymers have reactive isocyanato groups, (meth)acrylate groups, epoxy groups, nitrile groups, halomethyl group, cyclic anhydride of dicarboxylic acids or reactive aldehyde or ketone groups as shown above. Typical examples of such reactive polymers are those derived from isocyanatoethyl methacrylate, glycidyl methacrylate, (meth)acrylonitrile, chloromethylated styrene, maleic acid anhydride, and methyl vinyl ketone. For example, (Meth)acrylate functionalized polymers that can react with 1H-tetrazole-5-amine are typically made by introduction of the (meth)acrylic functionality into a polymer, for example, by reaction of —OH groups with (meth)acrylic acid chloride or by introducing β-halogeno-substituted propionic acid groups followed by dehydrohalogenation.

Furthermore, the polymers useful in this invention can also have pendant 1H-tetrazole groups as well as pendant radically polymerizable reactive side groups, such as (meth)acrylic groups, allyl groups, styryl groups, or other reactive side groups described for example, in Columns 5 and 6 of U.S. Pat. No. 6,702,437 (Fujimaki et al.). Some embodiments include a mixture of binders, one polymeric binder comprising pendant 1H-tetrazole groups and another polymeric binder having radical reactive side groups such as (meth)acrylic groups, allyl groups, styryl groups, or the side groups described in U.S. '437.

Negative-Working Imageable Compositions and Elements

In some embodiments of this invention, radiation-sensitive compositions comprise:

a radically polymerizable component, an initiator composition capable of generating free radicals sufficient to initiate polymerization of free radically polymerizable groups upon exposure to imaging radiation, a radiation absorbing compound, and a component having 1H-tetrazole groups that can either be a radically polymerizable component, or a polymer having pendant 1H-tetrazole groups attached to a backbone as defined above, or both types of components are present.

The negative-working radiation-sensitive composition may have any utility wherever there is a need for an applied coating that is polymerizable by exposure to suitable imaging radiation, and particularly where it is desired to remove unexposed regions of the coating instead of exposed regions. The radiation-sensitive compositions can be used to prepare an imageable layer in imageable elements such as printed circuit boards for integrated circuits, microoptical devices, color filters, photomasks, and printed forms such as negative-working lithographic printing plate precursors that are defined in more detail below.

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

The free radically polymerizable component can also be one or more of the non-polymeric components described above that have 1H-tetrazole groups and are also polymerizable in the presence of free radicals. Such components generally are mono-, di-, or triacrylates, or they are styryl compounds to which the 1H-tetrazole groups are attached. As noted above, there can be multiple free radically polymerizable components present in the radiation-sensitive composition.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. Nos. 6,309,792 (Hauck et al.), 6,569,603 (Furukawa), and 6,893,797 (Munnelly et al.). The free radically polymerizable component can also include carboxy groups as described for example in U.S. Pat. No. 7,153,632 (Saraiya et al.).

The one or more free radically polymerizable components (monomeric, oligomeric, or polymeric) can be present in the radiation-sensitive composition or imageable layer in an amount of at least 10 weight % and up to 70 weight %, and typically from about 20 to about 50 weight %, based on the total dry weight. The weight ratio of the free radically polymerizable component to the total polymeric binders (described below) is generally from about 5:95 to about 95:5, and typically from about 10:90 to about 90:10, or even from about 30:70 to about 70:30.

The radiation-sensitive composition (and imageable layer) also includes an initiator composition that is capable of generating free radicals sufficient to initiate polymerization of all the various free radically polymerizable components upon exposure of the composition to imaging radiation. The initiator composition is generally responsive to imaging radiation corresponding to the spectral range of at least 150 nm and up to and including 1400 nm. Initiator compositions are used that are appropriate for the desired imaging wavelength(s). More typically, they are responsive to either UV (or "violet") radiation at a wavelength of from about 150 to about 475 nm or to infrared radiation of at least 700 nm and up to and including 1200 nm.

In general, suitable initiator compositions comprise initiators that include but are not limited to, amines (such as alkanol amines), thiol compounds, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). For "violet"-sensitive compositions, the initiators are hexaarylbiimidazoles, oxime esters, or trihalomethyl substituted triazines.

Useful IR-sensitive radiation-sensitive compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N=N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are useful such as the iodonium salts. In one embodiment, the onium salt has a positively-charged iodonium, (4-methylphenyl)[4-(2-methylpropyl)phenyl]-moiety and a suitable negatively charged counterion. Typically anions for the iodonium initiators are chloride, bromide, nitrated, perchlorate, hexafluorephosphate, tetrafluoroboate, tetraphenylborate, and triphenylbutylborate anions. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful boron-containing compounds include organic boron salts that include an organic boron anion such as those described in U.S. Pat. No. 6,569,603 (Furukawa) that is paired with a suitable cation such as an alkali metal ion, an onium, or a cationic sensitizing dye. Useful onium cations for this purpose include but are not limited to, ammonium, sulfonium, phosphonium, iodonium, and diazonium cations. They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1,5-diphenyl-1,2,4-triazole, and 5-(p-aminophenyl)-3-mercapto-1,2,4-triazole.

Other useful initiator compositions include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Useful azine compounds are triazine compounds that include a 6-membered ring containing 3 carbon atoms and 3 nitrogen atoms such as those described in U.S. Pat. Nos. 6,309,792 (Hauck et al.), 6,010,824 (Komano et al.), 5,885,746 (Iwai et al), 5,496,903 (Watanabe et al.), and 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are useful in the initiator composition. Representative compounds of this type include but are not limited to, 1,3,5-triazine derivatives such as those having 1 to 3-$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxynaphtho-1yl)-4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)-

2-triazine, 2-(4-chlorophenyl-4,6-bis(trichloromethyl)-2-triazine, 2,4,6-tri(trichloromethyl)-2-triazine, and 2,4,6-tri(tribromomethyl)-2-triazine.

The azine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

Particularly useful initiators for use with IR-sensitive radiation-sensitive compositions are diaryliodonium borates in which the aryl groups of the cation can be substituted or unsubstituted. Possible substituents are described below in relation to Structure (IB). The borate anion has four valences filled with the same or different organic groups, for example, as described below for Structure (IBz).

Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium cation includes a positively charged iodonium, (4-methylphenyl)[4-(2-methylpropyl)phenyl]-moiety and a suitable negatively charged borate counterion.

Useful diaryliodonium borates include, but are not limited to, those represented by the following Structure (IB):

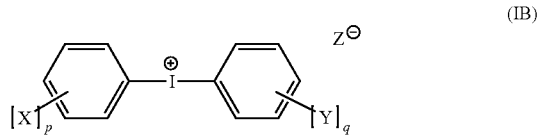

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds (that is, they have the same groups on both phenyl rings) are useful.

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

$Z^{\ominus}$ is an organic anion represented by the following Structure (IB$_Z$):

(IB$_z$)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^\ominus$ can be a tetraphenyl borate wherein the phenyl groups are substituted or unsubstituted (for example, all are unsubstituted).

Representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999).

The various free radical generating compounds (initiators) may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1,5-diphenyl-1,2,4-triazole, and 5-(p-aminophenyl)-3-mercapto-1,2,4-triazole.

Co-initiators can also be used, such as metallocenes (including titanocenes and ferrocenes), polycarboxylic acids (for example as described in EP 1,079,972 by Hauck et al.), haloalkyl triazines, thiols, or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

Metallocenes are organometallic compounds that have one or more cyclopentadienyl ligands that are optionally substituted at one or all of the ring carbons. Each carbon in the five-member ligand ring is coordinated to the transition metal center. Metallocenes are known for having a wide variety of transition metals including iron, titanium, tungsten, molybdenum, nickel, cobalt, chromium, zirconium, and manganese.

For example, ferrocenes have an iron center coordinated by at least one cyclopentadienyl ligand, but ferrocenes also include bicyclopentadienyl "sandwich" compounds. Suitable ferrocene compounds include those that have a hexhapto benzene ligand coordinated to the iron center. Examples of such compounds are described in Col. 7 of U.S. Pat. No. 6,936,384 (Munnelly et al.). Other suitable ferrocenes include compounds having halogenated, aryl-substituted, or haloaryl-substituted cyclopentadienyl ligands.

Titanocenes are also useful in the practice of this invention. Such compounds have a titanium center coordinated by at least one pentahapto cyclopentadienyl ligand and generally include additional ligands that may be known for organometallic complexes. Some suitable titanocene compounds include in their structures aryl ligands, haloaryl ligands, or pyrrole-substituted aryl ligands. Examples of useful titanocenes include those described in Col. 8 of U.S. Pat. No. 6,936,384 (noted above). One commercially available titanocene is (bis)cyclopentadienyl-(bis)2,6-difluoro-3-(pyrr-1-yl)phen-1-yl titanium sold by Ciba Specialty Chemicals as Irgacure® 784, as noted below with the Examples. Other suitable titanocenes are described in U.S. Pat. Nos. 4,548,891 (Riediker et al.), 4,590,287 (Riediker et al.), 5,008,302 (Husler et al.), 5,106,722 (Husler et al.), 6,010,824 (Komano et al.), and 6,153,660 (Fujimaki et al.).

It would be recognized by one skilled in the art that not every initiator (or co-initiator) can be used to advantage with every radiation absorbing compound (or sensitizer) described below. For example, some combinations of initiators and sensitizers may be unsuitable for photospeed or other properties, but it would require only routine experimentation in view of the teaching provided herein for a skilled worker to find the optimal combinations of initiators, optional co-initiators, and radiation absorbing compounds for a given spectral sensitivity to provide desired imaging, developability, and storage properties.

Thus, several initiator/co-initiator combinations can be used in various embodiments of the present invention, including but not limited to:

a) a triazine as described above in combination with a co-initiator that is an N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof) as described above, b) a boron-containing counterion that comprises four of the same or different alkyl or aryl groups, or any combination thereof, wherein the boron-containing counterion is a counterion for an infrared radiation absorbing dye, or is a counterion in an onium salt, c) a triazine as described above in combination with a co-initiator that is a mercaptan derivative as described above, d) an onium salt (such as an iodonium salt) as described above in combination with a co-initiator that is a metallocene (for example a titanocene or ferrocene) as described for example in U.S. Pat. No. 6,936,384 (noted above) and EP 684,522A1 (Baumann et al.), e) an iodonium salt (such as an iodonium borate) as described above in combination with a co-initiator that is a mercaptotriazole as described above, f) a triazine as described above in combination with an alkyl triarylborate or a tetraarylborate, g) a polyhaloalkyl-substituted compound or an azinium compound with a polycarboxylic acid, for example as described in EP 1,079,972 (noted above), and h) a hexaarylbiimidazole and a heterocyclic mercapto compound, such as a mercaptotriazole.

The free radical generating initiators in the initiator composition are generally present in the radiation-sensitive composition (or imageable layer) in an amount of at least 0.5% and up to and including 30%, and typically at least 2 and up to and including about 20%, based on total dry weight of the composition (or imageable layer). The optimum amount of the various initiator components (including co-initiators) may differ for various compounds and a given sensitivity of the radiation-sensitive composition can be designed by a one skilled in the art.

The radiation-sensitive composition (and imageable layer) generally includes one or more radiation absorbing compounds (or sensitizers) that absorb imaging radiation (or sensitize the composition to imaging radiation) having a spectral sensitivity of from the UV to the IR region of the electromagnetic spectrum, that is, at least 150 nm and up to and including 1400 nm. Some sensitizers can be used at any wavelength, but most sensitizers are optimally useful within certain wavelength ranges. For example, some sensitizers are optimal for use at an exposing wavelength of at least 150 nm and up to and including 650 nm (UV and violet to visible). Other sensitizers are particularly optimal for use for exposure to UV (violet) radiation of at least 150 nm and up to and including 475 nm, while still others are optimal for use at an exposure wavelength of at least 650 nm and up to and including 1500 nm (near IR and IR).

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 375 nm and up to and including 475 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.), WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Sensitizers that absorb in the visible region of the electromagnetic spectrum (that is at least 400 nm and up to and including 650 nm) can also be used. Examples of such sensitizers are well known in the art and include the compounds described in Cols. 17-22 of U.S. Pat. No. 6,569,603 (noted above). Other useful visible and UV-sensitive sensitizing compositions include a cyanine dye and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure $G-(Ar_1)_3$ wherein $Ar_1$ is the same or different, substituted or unsubstituted carbocyclic aryl group having 6 to 12 carbon atoms in the ring, and G is a furan or oxazole ring, or the Structure $G-(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a $—N(R'_4)(R'_5)$ group, or a $—OR'_6$ group wherein $R'_4$ through $R'_6$ independently represent substituted or unsubstituted alkyl or aryl groups as defined above. At least one of $R'_1$ through $R'_3$ is an $—N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet/visible radiation sensitizers includes compounds represented by the Structure $Ar_1$-$G$-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

EP 684,522 (noted above) describes visible radiation-sensitive compositions and imageable elements containing one or more dyes that have a spectral absorption in the range of from about 250 nm to about 700 nm.

In embodiments of this invention that are sensitive to near-infrared or infrared radiation, the radiation-sensitive compositions can comprise an infrared radiation absorbing compound that absorbs radiation of at least 700 nm and up to and including 1500 nm and typically of at least 700 nm and up to and including about 1200 nm.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,153,356 (Urano et al.), 6,264,920 (Achilefu et al.), 6,309,792 (Hauck et al.), and 6,787,281 (Tao et al.), and EP 1,182,033A2 (noted above).

A general description of one class of suitable cyanine dyes is shown by the formula in paragraph [0026] of WO 2004/101280 (Munnelly et al.), incorporated herein by reference, and a useful IR absorbing compounds is identified below with the Examples.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Other useful IR-sensitive dyes having the desired chromophore can be defined by the following Structure DYE-I:

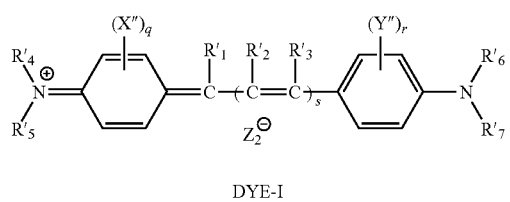

DYE-I wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 1, 2, or 3, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, X" and Y" are independently hydrogen or the carbon and heteroatoms needed to provide a fused aryl or heteroaryl ring.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Such IR-sensitive dyes can be represented by the following Structure DYE-II:

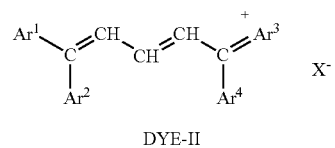

DYE-II wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, and halides.

Some embodiments of this invention include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Useful radiation absorbing compounds can be obtained from a number of commercial sources or they can be prepared using known starting materials and procedures.

The radiation absorbing compound (or sensitizer) can be present in the radiation-sensitive composition (and imageable layer) in an amount generally of at least 1% and up to and including 30% and typically at least 3 and up to and including 20%, based on total solids. The particular amount needed for this purpose would be readily apparent to one skilled in the art, depending upon the specific compound used to provide the desired chromophore.

The imageable layer includes one or more primary polymeric binders that provide the desired solubility in alkaline developers before exposure to imaging radiation. In most embodiments, the polymeric binder is a polymer having pendant 1H-tetrazole groups as described above. However, while such polymers need not be the sole or "primary" polymeric binders, in many embodiments, they are the only polymeric binders in the radiation-sensitive composition. The primary polymeric binder is generally present in the radiation-sensitive composition in an amount of from about 10 to about 70%, based on the total layer dry weight or solids.

Optional secondary polymeric binders include but are not limited to those having one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.). Other useful polymeric binders have vinyl groups in pendant groups that are described, for example in EP 1,182,033A1 (Fujimaki et al.) and U.S. Pat. Nos. 4,874,686 (Urabe et al.) and 7,041,416 (Wakata et al.) that are incorporated by reference, especially with respect to the general formulae (1) through (3) noted in EP 1,182,033A1. Some useful pendant reactive vinyl groups are alkenyl groups including but not limited to allyl esters, styryl, and (meth)acryloyl groups. For example, such groups can be provided by allyl (meth) acrylates, or by reacting a polymer precursor with an allyl halide, 4-vinylbenzyl chloride, or (meth)acryloyl chloride using conditions that would be apparent to a skilled worker in the art.

Additional secondary polymeric binders may be any of those known in the art for use in negative-working radiation-sensitive compositions other than those mentioned above. The secondary polymeric binder(s) may be present in an amount of from about 1.5 to about 70 weight % and typically from about 1.5 to about 40%, based on the dry coated weight of the radiation-sensitive composition (or imageable layer), and it may comprise from about 30 to about 60 weight % of the dry weight of all polymeric binders.

The secondary polymeric binders may be homogenous, that is, dissolved in the coating solvent, or may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in copending and commonly assigned U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinylcarbazole/styrene/methylacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenylmaleimide are useful.

Other useful secondary polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (typically from about 30 to about 500 nm and or from about 30 to about 150 nm). These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents. Further details about each commercial Hybridur® polymer dispersion can be obtained by visiting the Air Products and Chemicals, Inc. website.

The radiation-sensitive composition and imageable layer can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety.

Each phosphate moiety is typically connected to an acrylate moiety by an aliphatic chain [that is, an -(aliphatic-O)- chain] such as an alkyleneoxy chain [that is an -(alkylene-O)$_m$— chain] composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Useful phosphate (meth)acrylates can be represented by the following Structure (III):

$$P(=O)(OM)_n(OR)_{3-n} \quad (III)$$

wherein n is 1 or 2, M is hydrogen or a monovalent cation (such as an alkali metal ion, ammonium cations including cations that include one to four hydrogen atoms). For example, useful M cations include but are not limited to sodium, potassium, —NH$_4$, —NH(CH$_2$CH$_2$OH)$_3$, and —NH$_3$(CH$_2$CH$_2$OH). When n is 2, the M groups are the same or different. The compounds wherein M is hydrogen are particularly useful.

The R groups are independently the same or different groups represented by the following Structure (IV):

wherein R$^1$ and R$^2$ are independently hydrogen, or a halo (such as chloro or bromo) or substituted or unsubstituted alkyl group having 1 to 6 carbon atoms (such as methyl, chloromethyl, methoxymethyl, ethyl, isopropyl, and t-butyl groups). In many embodiments, one or both of R$^1$ and R$^2$ are hydrogen or methyl, and in some embodiments, R$^1$ is hydrogen and R$^2$ is methyl).

W is an aliphatic group having at least 2 carbon or oxygen atoms, or combination of carbon and oxygen atoms, in the chain, and q is 1 to 10. Thus, W can include one or more alkylene groups having 1 to 8 carbon atoms that are interrupted with one or more oxygen atoms (oxy groups), carbonyl, oxycarbonyl, or carbonyl oxy groups. For example, one such aliphatic group is an alkylenecarbonyloxyalkylene group. Useful alkylene groups included in the aliphatic groups have 2 to 5 carbon atoms and can be branched or linear in form.

The R groups can also independently be the same or different groups represented by the following Structure (V):

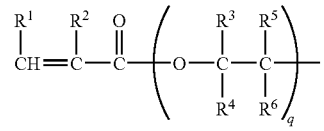

wherein R$^1$, R$^2$, and q are as defined above and R$^3$ through R$^6$ are independently hydrogen or a substituted or unsubstituted alkyl group having 1 to 6 carbon atoms (such as methyl, methoxymethyl), ethyl, chloromethyl, hydroxymethyl, ethyl, iso-propyl, n-butyl, t-butyl, and n-pentyl groups). Typically, R$^3$ through R$^6$ are independently hydrogen or methyl, and in most embodiments, all are hydrogen.

In Structures IV and V, q is 1 to 10, or from 2 to 8, for example from 3 to 6.

Representative phosphate (meth)acrylates useful in this invention are described for example, in U.S. Pat. No. 7,175,969 (Ray et al.).

The phosphate acrylate can be present in an amount of at least 0.5 and up to and including 20% and typically at least 0.9 and up to and including 10%, by weight of the total solids.

The radiation-sensitive composition and imageable layer can further comprise one or more trialkoxysilylalkyl (meth) acrylates or vinyl trialkoxysilanes, each of which has a molecular weight generally greater than 120 and typically at least 145 and up to and including 1,000.

The radiation-sensitive composition (and imageable layer) can also include a "primary additive" that is a poly(alkylene glycol) or an ether or ester thereof that has a molecular weight of at least 200 and up to and including 4000. This primary additive is present in an amount of at least 2 and up to and including 50 weight %, based on the total dry weight. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which can be obtained from Sartomer Company, Inc. In some embodiments, the primary additive may be "non-reactive" meaning that it does not contain polymerizable vinyl groups.

The radiation-sensitive composition (and imageable layer) can also include a "secondary additive" that is a poly(vinyl alcohol), a poly(vinyl pyrrolidone), poly(vinyl imidazole), or polyester in an amount of up to and including 20 weight % based on the total dry weight.

The radiation-sensitive composition (and imageable layer) can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, brilliant green, and phthalocyanine pigments such as copper phthalocyanine and metal-free phthalaocyanine), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

The radiation-sensitive composition that is sensitive to UV/violet radiation may include one or more thermopolymerization inhibitors such as those described on page 10 (lines 14-22) of WO 2004/074929 (noted above).

The negative-working imageable elements can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition that is directly applied to the substrate without any intermediate layer.

In some embodiments, the element may include what is conventionally known as an overcoat (also known as an "oxygen impermeable topcoat" or "oxygen barrier layer") disposed over the imageable layer, for example, as described in EP Patent Publications 1,788,429, 1,788,431 and 1,788,434 (all noted above) and U.S. Patent Application Publication 2005/0266349 (noted above). Such overcoat layers comprise a poly(vinyl alcohol) as the predominant polymeric binder. If present, the overcoat is the outermost layer of the imageable element.

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 g/m$^2$ and more typically from about 3 to about 4.3 g/m$^2$. Phosphoric acid anodization generally provides an oxide weight on the surface of from about 1.5 to about 5 g/m$^2$ and more typically from about 1 to about 3 g/m$^2$. When sulfuric acid is used for anodization, higher oxide weight (at least 3 g/m$^2$) may provide longer press life.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 µm and up to and including 700 µm.

The backside (non-imaging side) of the substrate may be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

A radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, polymeric binder(s), initiator composition, radiation absorbing compound, component having 1H-tetrazole groups, and any other components of the radiation-sensitive composition in a suitable coating solvent including water, organic solvents [such as glycol ethers including 1-methoxypropan-2-ol, methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents and negative-working imageable layer formulations are described in the Examples 1-5 below. After proper drying, the coating weight of the imageable layer is generally at least 0.1 and up to and including 5 g/m$^2$ or at least 0.5 and up to and including 3.5 g/m$^2$.

Once the imageable layer formulation has been applied and dried on the substrate, and any overcoat formulation has been applied and dried, the imageable element can be enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed. Further details of this process of single or stacks of imageable elements are provided in U.S. Pat. No. 7,175,969 (noted above).

Positive-Working Imageable Elements

Other useful embodiments of this invention are positive-working imageable elements each of which comprises at least one imageable layer comprising a polymer having a backbone and the pendant 1H-tetrazole groups attached thereto, as described above.

For example, the polymer can be represented by Structure (I) as described above wherein x is from about 3 to 100 mol %, and y is from 0 to about 97 mol %. In some embodiments of the positive-working imageable elements, x is from about 3 to about 97 mol %, y is from about 3 to about 97 mol %, A represents recurring units comprising carbon-carbon backbone derived from one or more ethylenically unsaturated polymerizable monomers, and the 1H-tetrazole groups are attached to the backbone through a linking group L comprising a —C(=O)—NR$^1$—, —NR$^1$—, —NR$^1$—(C=O)—NR$^2$—, —S—, —OCO(=O)—, or —CH=N— group, or a combination thereof, R$^1$ and R$^2$ are independently hydrogen or alkyl, aryl, or cycloalkyl groups, and L optionally includes one or more alkylene or arylene group, and B represent recurring units derived from one or more (meth)acrylates, (meth)acrylamides, (meth)acrylonitriles, styrene or styrene derivatives, vinyl acetate, vinyl pyrrolidone, vinyl alcohol, maleimide, or half esters of ring-opened maleic acid anhydrides.

Some embodiments of such positive-working imageable elements comprise a single imageable layer while others comprise an inner imageable layer and an outer imageable layer disposed on the inner imageable layer. The polymer having the pendant 1H-tetrazole groups described above can be dispersed within the single imageable layer, or in either or both of the inner and outer imageable layers of the multi-layer imageable elements. In most embodiments, the polymer is present in only one of the two imageable layers in such elements.

Single-Layer Imageable Elements

In general, single-layer imageable elements are formed by suitable application of an imageable layer formulation containing one or more polymeric binders and the discrete particles to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. Specific details of such substrates and how they can be prepared are described above in relation to the negative-working imageable elements. Metal supports that include sheets or foils of aluminum, copper, zinc, titanium, and alloys thereof are particularly useful.

The single-layer, positive-working imageable element also includes one or more radiation absorbing compounds. While these compounds can be sensitive to any suitable energy form (including UV or visible radiation), they are usually sensitive to near-infrared or infrared radiation and thus, the radiation absorbing compounds having spectral sensitivity to from about 700 to about 1400 nm and typically from about 700 to about 1200 nm. Examples of suitable infrared radiation-sensitive compounds, including IR dyes are described above in relation to the negative-working imageable elements.

The radiation absorbing compound is generally present in the imageable element in an amount sufficient to render the imageable layer insoluble to an aqueous developer after exposure to appropriate radiation. This amount is generally at least 0.5% and up to 30 weight % and typically from about 3 to about 10 weight % (based on total dry layer weight). In most embodiments, the radiation absorbing compound is present in the single imageable layer. Alternatively or additionally, radiation absorbing compounds may be located in a separate layer that is in thermal contact with the single imageable layer. Thus, during imaging, the action of the radiation absorbing compound can be transferred to the single imageable layer without the compound originally being incorporated into it.

In addition, solubility-suppressing components are optionally incorporated into the single imageable layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The polymeric binders used in the imageable layer are generally soluble in alkaline developers (defined below) after thermal imaging. As noted above, the imageable layers can include one or more components having 1H-tetrazole groups. In most embodiments of the positive-working imageable elements, these components are polymers and if present in sufficient amount, they act as polymeric binders for the imageable layers. In such embodiments, the polymer(s) having pendant 1H-tetrazole groups are present in an amount of at least 10 weight % and typically from about 20 to about 80 weight % of the total dry imageable layer weight.

The imageable layer can also include additional polymers or polymeric binders. They can be poly(vinyl phenols) or derivatives thereof, or phenolic polymers. They may include carboxylic (carboxy), sulfonic (sulfo), phosphonic (phosphono), or phosphoric acid groups that are incorporated into the polymer molecule. Other useful additional polymers include but are not limited to, novolak resins, resole resins, poly(vinyl acetals) having pendant phenolic groups, and mixtures of any of these resins (such as mixtures of one or more novolak resins and one or more resole resins). The novolak resins are most useful in combination with the polymers having pendant 1H-tetrazole groups. Generally, such resins have a number average molecular weight of at least 3,000 and up to 200,000, and typically from about 6,000 to about 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful additional resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. Nos. 5,554,719 (Sounik) and 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon et al.), that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000, preferably from about 1,000 to about 10,000, and more preferably from about 3,000 to about 7,000. In addition, they may have a polydispersity less than 2 and preferably from about 1.5 to about 1.9. The branched poly(hydroxystyrenes) can be homopolymers or copolymers with non-branched hydroxystyrene recurring units.

One group of useful polymeric binders are poly(vinyl phenol) and derivatives thereof. Such polymers are obtained generally by polymerization of vinyl phenol monomers, that is, substituted or unsubstituted vinyl phenols. Substituted vinyl phenol recurring units include those described below for the "a" recurring units in Structure (I). Some vinyl phenol copolymers are described in EP 1,669,803A (Barclay et al.).

Other useful polymeric binders are modified novolak or resole resins that are represented by Structure (POLYMER):

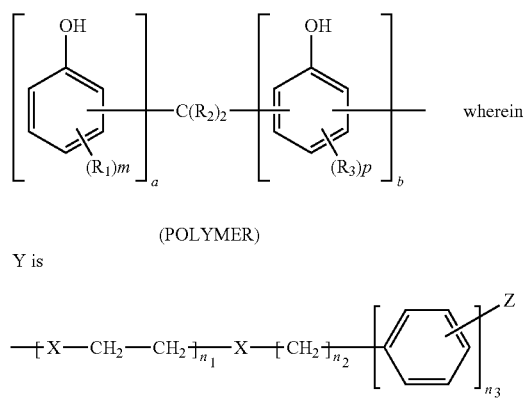

(POLYMER)

Y is a is from about 90 to about 99 mol % (typically from about 92 to about 98 mol %), b is from about 1 to about 10 mol % (typically from about 2 to about 8 mol %), $R_1$ and $R_3$ are independently hydrogen or hydroxy, alkyl, or alkoxy groups, $R_2$ is hydrogen or an alkyl group, X is an alkylene, oxy, thio, —OC(=O)Ar—, —OC(=O)CH=CH—, or —OCO(CH$_2$)$_{n4}$— group wherein Ar is an aryl group, m and p are independently 1 or 2, $n_3$ is 0 or an integer up to 5 (for example 0, 1, 2, or 3), $n_2$ is 0 or an integer up to 5 (for example, 0, 1, or 2), $n_3$ is 0 or 1 (typically 0), $n_4$ is at least 1 (for example, up to 8), and Z is —C(=O)OH, —S(=O)$_2$OH, —P(=O)(OH)$_2$, or —OP(=O)(OH)$_2$.

The alkyl and alkoxy groups present in the primary polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also include "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain. Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the polymeric binder comprises recurring units represented by Structure (POLYMER) wherein a is from about 92 to about 98 mol %, b is from about 2 to about 8 mol % and Z is —C(=O)OH, and is present at a dry coverage of from about 15 to 100 weight % based on the total dry weight of the layer.

Other polymeric binders that may be in the imageable layer include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. Nos. 5,705,308 (West et al.) and 5,705,322 (West et al.). Other useful secondary binder resins include acrylate copolymers as described for example in EP 737,896A (Ishizuka et al.), cellulose esters and poly(vinyl acetals) as described for example in U.S. Pat. No. 6,391,524 (Yates et al.), DE 10 239 505 (Timpe et al.), and WO 2004081662 (Memetea et al.).

The additional polymeric binder can be present in the imageable layer at a dry coverage of from about 15 to 100 weight % (typically from about 30 to about 95 weight %) based on the total dry imageable layer weight.

The single imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer imageable element can be prepared by applying the layer formulation over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be from about 0.5 to about 2.5 g/m² and typically from about 1 to about 2 g/m².

The selection of solvents used to coat the imageable layer formulation depends upon the nature of the polymeric materials and other components in the formulations. Generally, the imageable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

A representative single-layer positive-working imageable element of this invention is described in Example 9 below.

Multi-Layer Imageable Elements

In general, the multi-layer, positive-working imageable elements of this invention comprise a substrate, an inner layer (also known in the art as an "underlayer"), and an outer layer (also known in the art as a "top layer" or "topcoat") disposed over the inner layer. Before thermal imaging, the outer layer is generally not soluble or removable by an alkaline developer within the usual time allotted for development, but after thermal imaging, the exposed regions of the outer layer are soluble in the alkaline developer. The inner layer is also generally removable by the alkaline developer. A radiation absorbing compound (described above) can also be present in such imageable elements, and is typically present in the inner layer but may optionally be in a separate layer between the inner and outer layers.

The imageable elements are formed by suitable application of an inner layer composition onto a suitable substrate. This substrate can be an untreated or uncoated support but it is usually treated or coated in various ways as described above prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. Further details of such substrates are provided above in relation to the negative-working imageable elements.

The inner layer is disposed between the outer layer and the substrate. Typically, it is disposed directly on the substrate (including any hydrophilic coatings as described above). The inner layer comprises a first polymeric binder that is removable by the lower pH developer and typically soluble in the developer to reduce sludging of the developer. In addition, the first polymeric binder is usually insoluble in the solvent used to coat the outer layer so that the outer layer can be coated over the inner layer without dissolving the inner layer. Mixtures of these first polymeric binders can be used if desired in the inner layer. This first polymeric binder can be a polymer having pendant 1H-tetrazole groups that are described in more detail above. Such polymeric binders are generally present in the inner layer in an amount of at least 10 weight %, and generally from about 60 to 95 weight % of the total dry inner layer weight.

Other useful polymeric binders for the inner layer include (meth)acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. Still other useful polymeric binders include polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Polymeric binders of this type include copolymers that comprise from about 20 to about 75 mol % and typically about 35 to about 60 mol % or recurring units derived from N-phenylmaleimide, N-cyclohexyl-maleimide, N-(4-carboxyphenyl)maleimide, N-benzylmaleimide, or a mixture thereof, from about 10 to about 50 mol % of recurring units derived from acrylamide, methacrylamide, or a mixture thereof, and from about 5 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

Still other useful polymeric binders in the inner layer can comprise, in polymerized form, from about 5 mol % to about 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % of recurring units derived from N-phenylmaleimide, N-cyclohexylmaleimide, or a mixture thereof, optionally, from about 5 mol % to about 50 mol % of recurring units derived from methacrylamide, and from about 3 mol % to about 50 mol % one or more recurring units derived from monomer compounds of the following Structure:

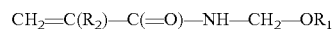

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl, as described for example in U.S. Pat. No. 7,186,482 (Kitson et al.). Methods of preparation of certain of these polymeric materials are disclosed in U.S. Pat. No. 6,475,692 (Jarek).

Additional useful polymeric binders for the inner layer are described for example, in U.S. Pat. Nos. 7,144,661 (Ray et al.), 7,163,777 (Ray et al.), and 7,223,506 (Kitson et al.), and U.S. Patent Application Publications 2006/0257764 (Ray et al.) and 2007/0172747 (Ray et al.).

The additional polymeric binders can comprise more than 50% and up to 100% (dry weight) of the total polymeric materials in the inner layer. Still other useful additional polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the Structure (XI):

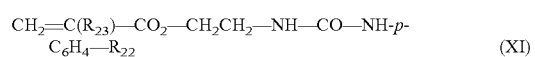

(XI)

wherein $R_{22}$ is OH, COOH, or $SO_2NH_2$, and $R_{23}$ is H or methyl, and, optionally, from about 1 to about 30 mole % from about 3 to about 20 mole % of recurring units derived from one or more monomers of the Structure (XII):

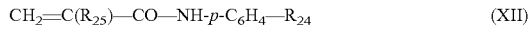

$$CH_2\!=\!C(R_{25})\!-\!CO\!-\!NH\text{-}p\text{-}C_6H_4\!-\!R_{24} \qquad (XII)$$

wherein $R_{24}$ is OH, COOH, or $SO_2NH_2$, and $R_{25}$ is H or methyl.

The inner layer may also comprise one or more secondary additional polymeric materials that are resins having activated methylol and/or activated alkylated methylol groups. The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical). The resin having activated methylol and/or activated alkylated methylol groups is typically a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide). Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 (Shimazu et al.) and 6,528,228 (Savariar-Hauck et al.).

In most embodiments, the inner layer further comprises a radiation absorbing compound (that is usually an infrared radiation absorbing compound) that absorbs radiation at from about 700 to about 1400 and typically at from about 700 to about 1200 nm. Examples of useful radiation absorbing compounds are described above in relation to the negative-working imageable elements. In most embodiments, the infrared radiation absorbing compound is present only in the inner layer.

The radiation absorbing compound can be present in the multi-layer imageable element in an amount of generally at least 0.5% and up to 30% and typically from about 3 to about 25%, based on the total dry weight of the layer in which the compound is located. The particular amount of a given compound to be used could be readily determined by one skilled in the art.

The inner layer can include other components such as surfactants, dispersing aids, humectants, biocides, viscosity builders, drying agents, defoamers, preservatives, antioxidants, colorants, or organic or inorganic particles.

The inner layer generally has a dry coating coverage of from about 0.5 to about 2.5 g/m² and typically from about 1 to about 2 g/m². The total polymeric binders described above generally comprise at least 50 weight % and typically from about 60 to about 90 weight % based on the total dry layer weight, and this amount can be varied depending upon what other polymers and chemical components are present. As noted above, the polymers having pendant 1H-tetrazole groups can be the only polymeric binder in the inner layer, or one among several polymeric binders. Any additional polymeric materials (such as a novolak, resole, or copolymers noted above) can be present in an amount of from about 5 to about 45 weight % based on the total dry weight of the inner layer.

The outer layer of the imageable element is disposed over the inner layer and in most embodiments there are no intermediate layers between the inner and outer layers. The outer layer comprises a second polymeric binder that is usually different than the first polymeric binder described above. This second polymeric binder can be one or more of the polymeric binders as defined above for the single-layer imageable element. Other useful polymeric binders are described for example, in U.S. Pat. Nos. 7,163,770 (Saraiya et al.) and 7,160,653 (Huang et al.). However, the outer layer can also include a polymer having pendant 1H-tetrazole groups as described above. Such polymers can be only in the outer layer, or the same or different polymers with pendant 1H-tetrazole groups can be in both inner and outer layers. In many embodiments, the outer layer is substantially free of radiation absorbing compounds, meaning that none of these compounds are purposely incorporated therein and insubstantial amounts diffuse into it from other layers. However, in other embodiments, the radiation absorbing compound may be in the outer layer only, or in both the outer and inner layers, as described for example in EP 1,439,058A2 (Watanabe et al.) and EP 1,738,901A1 (Lingier et al.), as in an intermediate layer as described above.

The one or more second polymeric binders are present in the outer layer at a dry coverage of from about 15 to 100 weight %, typically from about 70 to about 98 weight %, based on total dry weight of the outer layer.

The outer layer generally also includes colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element. The outer layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of from about 0.2 to about 2 g/m² and typically from about 0.4 to about 1.5 g/m².

There may be a separate layer that is between and in contact with the inner and outer layers. This separate layer can act as a barrier to minimize migration of radiation absorbing compound(s) from the inner layer to the outer layer. This separate "barrier" layer generally comprises other polymeric binders that are soluble in the alkaline developer. If this polymeric binder is different from the first polymeric binder(s) in the inner layer, it is typically soluble in at least one organic solvent in which the inner layer first polymeric binders are insoluble. A useful polymeric binder is a poly(vinyl alcohol). Generally, this barrier layer should be less than one-fifth as thick as the inner layer, and typically less than one-tenth as thick as the inner layer.

Alternatively, there may be a separate layer between the inner and outer layers that contains the infrared radiation absorbing compound(s), which may also be present in the inner layer, or solely in the separate layer.

The multi-layer imageable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

For example, a multi-layer imageable element can be prepared with an inner layer comprising a first polymeric binder and a radiation absorbing compound, and an ink receptive outer layer comprising a second polymeric binder that is usually different than the first polymeric binder and is soluble in an alkaline developer upon exposure to imaging radiation.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support.

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web. When conditioned in a stack, the individual imageable elements may be separated by suitable interleaving papers. Such papers are available from several commercial sources. The interleaving papers may be kept between the imageable elements after conditioning during packing, shipping, and use by the customer.

Representative methods for preparing multi-layer imageable elements of this invention are shown in Invention Examples 6-8 below.

Imaging Conditions

The imageable elements can have any useful form and size or shape including but not limited to, printing plate precursors, printing cylinders, printing sleeves (both hollow or solid), and printing tapes (including flexible printing webs).

During use, the positive-working and negative-working imageable elements of this invention are exposed to a suitable source of imaging or exposing radiation at a wavelength of from about 150 to about 1500 nm. For example, imaging can be carried out using imaging or exposing radiation, such as from an infrared laser at a wavelength of at least 750 nm and up to and including about 1400 nm and typically at least 700 nm and up to and including 1200 nm. Imaging can be carried out using imaging radiation at multiple wavelengths at the same time if desired. Other imageable elements, especially negative-working imageable elements can be exposed to a suitable source of UV, "violet", or visible imaging radiation.

Thus, in some embodiments of the method of this invention, the imageable element can have a spectral sensitivity to imagewise exposure that is carried out at a wavelength of from about 250 to about 475 nm, or to imagewise exposure that is carried out at a wavelength of from about 750 to about 1250 nm.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful near-infrared and infrared imaging apparatus is available as models of Creo Trendsetter or Creo Quantum 800 imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 250 nm and up to and including 450 nm), can be carried out generally using energies of at least 0.01 mJ/cm$^2$ and up to and including 0.5 mJ/cm$^2$, and typically at least 0.02 and up to and including about 0.1 mJ/cm$^2$. It would be desirable, for example, to image the UV/visible radiation-sensitive imageable elements at a power density in the range of at least 0.5 and up to and including 50 kW/cm$^2$ and typically of at least 5 and up to and including 30 kW/cm$^2$.

After imaging of negative-working imageable elements, a heating step might be used to accelerate the formation of a latent image. This heating step can be realized in so called "preheat units" that can be a separate machine or integrated into the processor that develops the imaged element. There are different types of preheat units. The most common ones use infrared radiation or hot air circulation, or combination thereof, to heat the imaged element. The temperature used for the purpose is from about 70 to about 200° C. and typically from about 90 to about 160° C.

Before developing the imaged element, a pre-rinse step might be carried out especially for the negative-working elements having a protective oxygen barrier or topcoat. This pre-rinse step can be carried out in a stand-alone apparatus or by manually rinsing the imaged element with water, or the pre-rinse step can be carried out in a washing unit that is integrated in a processor used for developing the imaged element. For the free radical generating radiation-sensitive compositions and imageable elements, both the preheat unit and the pre-rinse unit are usually integrated into the processor used for developing the imaged element.

Development and Printing

With or without the need for a preheat step after imaging, the imaged elements can be developed "off-press" using conventional processing and an aqueous solution such as an aqueous developer.

As one skilled in the art would understand, the best developers for negative-working imaging elements of this invention will likely be different than the best developers for the single- or multi-layer positive imageable elements. A skilled worker would be able to determine from the level of skill and teaching in the art which developers are best with a given type of imageable element of this invention, especially in view of the guidance of the Examples below.

The developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally from about 4 to about 14. The imaged elements are generally developed using conventional processing conditions. Aqueous alkaline developers and organic solvent-containing alkaline developers can be used.

Organic solvent-containing alkaline developers are generally single-phase solutions of one or more organic solvents that are miscible with water, and generally have a pH below 12. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative organic solvent-containing alkaline developers include ND-1 Developer, 955 Developer, 956 Developer, 989 Developer, Developer 980, and 956 Developer (available from Eastman Kodak Company), HDN-1 Developer and LP-DS Developer (available from Fuji Photo), and EN 232 Developer and PL10 Developer (available from Agfa).

Useful aqueous alkaline developers generally have a pH of at least 7 and preferably of at least 11 and up to 13.5. Such developers include but are note limited to, 3000 Developer, 9000 Developer, Goldstar® Developer, Goldstar® Plus Developer, Goldstar® Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo), and Energy CTP Developer (Agfa). These compositions also generally include surfactants, chelating agents (such as salts of ethylenediaminetetraacetic acid), and alkaline components (such as inorganic metasilicates, organic metasilicates, hydroxides, and bicarbonates).

Such alkaline developers can also include one or more "coating-attack suppressing agents" that are developer-soluble compounds that suppress developer attack of the outer layer. "Developer-soluble" means that enough of the agent(s) will dissolve in the developer to suppress attack by the developer. Mixtures of these compounds can be used. Typically, the coating-attack suppressing agents are developer-soluble polyethoxylated, polypropoxylated, or polybutoxylated compounds that include recurring —(CH$_2$—CHR$_a$—O—)— units in which R$_a$ is hydrogen or a methyl or ethyl group. Each agent can have the same or different recurring units (in a random or block fashion). Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.) that is incorporated herein by reference.

Developers having a pH of from about 4 to about 9 are useful for developing imaged elements in the absence of post-rinse and gumming steps after development (so called "single bath development"). Such developers contain in most cases hydrophilic polymers like gum Arabic, polyvinyl alcohol, poly(acrylic acid), or other hydrophilic polymers to protect the developed plate against fingerprints and to prevent toning of the plate when used on a printing press.

Generally, a developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals. These development processes can be carried out in suitable developing processors or equipment using standard residence times and recirculation and replenishment rates.

Following this off-press development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the imaged element.

In alternative embodiments, with or without a post-exposure baking step after imaging and before development, the imaged elements can be developed "off-press" using a gum (or gum solution) as described below. A gum solution is typically an aqueous liquid that comprises one or more surface protective compounds capable of protecting the lithographic image of the printing plate against contamination (for example, oxidation, fingerprints, dust or scratches). There are generally two types of "gum" solutions known in the art: (1) a "bake", "baking", or "pre-bake" gum usually contains one or more compounds that do not evaporate at the usual pre-bake temperatures used for making lithographic printing plates, typically an anionic or nonionic surfactant, and (2) a "finisher" gum that usually contains one or more hydrophilic polymers (both synthetic and naturally-occurring, such as gum Arabic cellulosic compounds, (meth)acrylic acid polymers, and polysaccharides) that are useful for providing a protective overcoat on a printing plate. The gums used in the practice of these embodiments would be generally considered "pre-bake" gums, and thus, usually lack the hydrophilic polymers.

By using this gum for development, the conventional aqueous developer compositions having a pH of at least 4 and up to and including 14, can be avoided.

The gum may be provided in diluted or concentrated form. The amounts of components described below refer to amount in the diluted gum that is likely its form for use in the practice of the invention. However, it is to be understood that concentrated gums can be used and the amounts of various components (such as the anionic surfactants) would be correspondingly increased.

The gum is an aqueous solution that generally has a pH greater than 3 and up to about 9 as adjusted using a suitable amount of a base. The viscosity of the gum can be adjusted to a value of from about 1.7 to about 5 cP by adding a suitable amount of a viscosity increasing compound such as a poly(vinyl alcohol) or poly(ethylene oxide).

In addition, these gums have one or more anionic surfactants as the only essential component, even though optional components (described below) can be present if desired.

Useful anionic surfactants include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhdyride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Several commercial examples are described in the Examples below. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically from about 1 to about 45 weight %, or from about 3 to about 30 weight % (based on the weight of the gum).

Two or more anionic surfactants ("first", "second", etc.) can be used in combination. In such mixtures, a first anionic surfactant, such as an alkyldiphenyloxide disulfonate, can be present generally in an amount of at least 1 weight % and typically from about 3 to about 30 weight %. A second surfactant can be present (same or different from the first anionic surfactant) in a total amount of at least 0.1 weight %, and typically from about 2 to about 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The gums may include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglycol. These nonionic surfactants can be present in an amount of up to 10 weight %, but at usually less than 2 weight %.

Other optional components of the gum include inorganic salts (such as those described in [0032] of U.S. Patent Application 2005/0266349, noted above), wetting agents (such as a glycol), a metal chelating agents, antiseptic agents, antifoaming agents, ink receptivity agents (such as those described in [0038] of US '349), and viscosity increasing agents as noted above. The amounts of such components are known in the art. Calcium ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof.

Organic amines may also be useful. A chelating agent may be present in the gum in an amount of from about 0.001 to about 1 weight %.

Generally, the gum is applied to the imaged element by rubbing, spraying, jetting, dipping, coating, or wiping the outer layer with the gum or a roller, impregnated pad, or applicator containing the gum. For example, the imaged element can be brushed with the gum, or the gum may be poured on or applied by spraying the outer layer with sufficient force to remove the exposed regions using a spray nozzle system as described for example in [0124] of EP 1,788,431A2 (noted above). Still again, the imaged element can be immersed in the gum and rubbed by hand or with an apparatus.

The gum can also be applied in a gumming unit (or gumming station) that has at least one roller for rubbing or brushing the printing plate while the gum is applied during development. By using such a gumming unit, the non-exposed regions of the imaged layer may be removed from the substrate more completely and quickly. The gum used in development can be collected in a tank and the gum can be used several times, and replenished if necessary from a reservoir of gum. The gum replenisher can be of the same concentration as that used in development, or be provided in concentrated form and diluted with water at an appropriate time.

Following off-press development, a postbake operation can be carried out, with or without a blanket or floodwise exposure to UV or visible radiation. The imaged and developed element can be baked in a postbake operation to increase run length of the resulting imaged element. Baking can be carried out, for example at from about 170° C. to about 240° C. for from about 7 to about 10 minutes, or at about 120° C. for 30 minutes. Alternatively, a blanket UV or visible radiation exposure can be carried out, without a postbake operation.

Thus, whatever the developing process, the method of this invention can be carried out by omitting the post-exposure baking step and removing predominantly only the non-exposed regions by development to provide a negative-working lithographic printing plate having a hydrophilic aluminum-containing substrate.

Alternatively, predominantly only the exposed regions are removed during developing to provide a positive-working lithographic printing plate having a hydrophilic aluminum-containing substrate.

As one skilled in the art would know, such development processes may remove insignificant amounts of the exposed regions (for negative-working) or non-exposed regions (for positive-working), but not enough to significantly affect the desired image.

In some embodiments, the method of this invention is used to provide a negative-working or positive-working lithographic printing plate by imaging and developing an imageable element that comprises a polymer that is present in the imageable layer in an amount of at least 5% and up to and including 95% based on the total imageable layer dry weight, and is represented by the following Structure (I):

$-(A)_x-(B)_y-$      (I)

wherein x is from about 3 to about 97 mol %, y is from about 3 to about 97 mol %, A represents recurring units comprising carbon-carbon backbone derived from one or more ethylenically unsaturated polymerizable monomers, and said 1H-tetrazole groups are attached to said backbone through a linking group L comprising a —C(=O)—NR$^1$—, —NR$^1$—, —NR$^1$—(C=O)—NR$^2$—, —S—, —OCO(=O)—, or —CH=N— group, or a combination thereof, R$^1$ and R$^2$ are independently hydrogen or alkyl, aryl, or cycloalkyl groups, and B represent recurring units derived from one or more (meth)acrylates, (meth)acrylamides, (meth)acrylonitriles, styrene or styrene derivatives, vinyl acetate, vinyl pyrrolidone, vinyl alcohol, maleimide, or half esters of ring-opened maleic acid anhydrides.

The negative-working imageable elements of this invention containing a component with 1H-tetrazole groups can also be developed (or imaged and developed) on-press. On-press development avoids the use of alkaline developing solutions typically used in conventional processing apparatus. The imaged element is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

Printing can be carried out by applying a lithographic ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

AIBN represents 2,2'-azobis(iso-butyronitrile).

AMA represents allyl methacrylate.

BC represents ethylene glycol monobutyl ether (or Butyl Cellusolve).

BLO is γ-butyrolactone.

Byk® 307 is a polyethoxylated dimethylpolysiloxane copolymer that is available from Byk Chemie (Wallingford, Conn.) in a 25 wt. % xylene/methoxypropyl acetate solution.

Copolymer A represents a copolymer having recurring units derived from N-phenylmaleimide, methacrylamide, and methacrylic acid (45:35:20 mol %) using conventional conditions and procedures.

Copolymer B represents a copolymer having recurring units derived from N-phenylmaleimide, methacrylamide, N-(2-methacryloyloxyethyl)ethylene urea and methacrylic acid (37:20:29:14 mol %) using conventional conditions and procedures.

Copolymer G is a the product obtained by stirring 20 g of Copolymer A (defined above) dissolved in 100 g of methoxyethanol with 0.19 g of NaOH and 3.53 g of IR Dye A, precipitating after 4 hours in 1 liter of water, filtering and drying the product at 40° C. for 24 hours.

DAA represents diacetone alcohol.

DEK represents diethyl ketone.

Developer D1 comprised water (94.73 wt. %), potassium hydroxide solution (45 wt. %) at 0.17 wt. %, Blaunon B13 (5.1 wt. %). After mixing, the pH was adjusted to 12 with a few drops of a 30 wt. % KOH solution.

DMF represents N,N-dimethylformamide.

Dowanol® PM is propylene glycol methyl ether that was obtained from Dow Chemical Company (Midland, Mich.). It is also sometimes identified as PGME.

Dowanol® PMA is 1-methoxy-2-propyl acetate that was obtained from Dow Chemical Company.

Dye D11 (CAS 433334-19-1) is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France), having the following structure:

D11

Ethyl violet is assigned C.I. 42600 (CAS 2390-59-2, $\lambda_{max}$=596 nm) and has a formula of p-$(CH_3CH_2)_2NC_6H_4)_3C^+Cl^-$.

GP649D99 is a resole resin that was obtained from Georgia-Pacific (Atlanta, Ga.).

HMDI represents hexamethylene diisocyanate.

HEMA represent hydroxyethyl methacrylate.

HEPi represents 2(2-hydroxyethyl)-piperidine.

IPMAA represents N-isopropyl methacrylamide.

IR Dye A (Trump) is represented by the following formula and can be obtained from Eastman Kodak Company (Rochester, N.Y.):

MAA represents methacrylic acid.

MAM represents methacrylamide.

MAT represents 5-(methacrylamido)tetrazole.

MMA represents methyl methacrylate.

Newcol B 13 is an ethoxylated beta-naphthol that was obtained from Nippon Nyukazai Co., Ltd. (Japan).

NK Ester BPE 500 is an ethoxylated Bisphenol A dimethacrylate with about 10 ethylene oxide units that was obtained from Shin-Nakamura Ltd. (Japan).

PD 494 and PD 140A are a meta/para cresol novolaks that were obtained from Borden Chemicals (Louisville, Ky.).

N-PMI represents N-phenylmaleimide.

PVPA represents poly(vinyl phosphonic acid).

RAR 62 has the following structure:

SMA 1000 is a styrene-maleic anhydride copolymer that was obtained from Cray Valley (France).

Substrate A is a 0.3 mm gauge aluminum sheet that had been electrograined, anodized, and subjected to treatment poly(vinyl phosphonic acid).

THF represents tetrahydrofuran.

TN13 is a 15 mole % tosylated N13 that was obtained from Eastman Kodak Company (Rochester, N.Y.).

UMA represents N-(2-methacryloyloxyethyl)ethylene urea, a monomer that is available from Degussa (German).

956 Developer, 980 Developer, and GoldStar® Premium Developer are available from Eastman Kodak Company (Rochester, N.Y.).

Synthesis Example 1

MAT

5-Amino-1,2,3,4-tetrazole (10.1 g) was dispersed in a mixture of 250 ml of THF and 12 ml of water. Methacryloylchloride (10.7 g) was added under stirring at 20° C. After adding ~⅓ of the methacryloylchloride within 10 minutes, the solution became clear and about 15 minutes later after adding the whole amount of the methacryloylchloride, precipitation of white crystals started. After 2 hours of stirring at room temperature, the dispersion was cooled down to 4° C. and kept at this temperature for 24 hours. After filtration, the resulting crystals were dried in vacuum at 20° C. for 24 hours. The melting point was 238.5-239.5° C. and the UV absorption maximum was 269 nm.

Synthesis Example 2

Copolymer of MAT/AMA/IPMAA, Molar Ratio=10:70:20

MAT (2.9 g), AMA (17.7 g), IPMAA (5.1 g), and AIBN (0.2 g) were dissolved in 295 g of DMF. After removing the oxygen by air bubbling, the solution was heated at 70° C. for 8 hours. After cooling to room temperature, a white polymer was precipitated with water. The resulting polymer was dried in vacuum at 25° C. for 24 hours. It had an acid number of 43.8 mg KOH/g. GPC: Mw=30,900, Mn=6050.

Synthesis Example 3

Copolymer of MAT/AMA/IPMAA, Molar Ratio=20:60:20

MAT (5.7 g), AMA (15.1 g), IPMAA (5.1 g), and AIBN (0.2 g) were dissolved in 299 g of DMF. After removing the oxygen by air bubbling, the solution was heated at 70° C. for 8 hours. After cooling to room temperature, a white polymer was precipitated with water. The resulting polymer was dried in vacuum at 25° C. for 24 hours. It had an acid number of 73.6 mg KOH/g. GPC: Mw=12600, Mn=4900.

Synthesis Example 4

Copolymer of MAT/AMA/IPMAA, Molar Ratio=30:50:20

MAT (8.6 g), AMA (12.6 g), IPMAA (5.1 g), and AIBN (0.2 g) were dissolved in 302 g of DMF. After removing the oxygen by air bubbling, the solution was heated at 70° C. for 8 hours. After cooling to room temperature, a white polymer was precipitated with water. The resulting polymer was dried in vacuum at 25° C. for 24 hours. It had an acid number of 92.7 mg KOH/g. GPC: Mw=14300, Mn=6100.

Synthesis Example 5

Copolymer of MAT/MMA, Molar Ratio=14:86

MAT (8 g), MMA (34.4 g), and AIBN (0.4 g) were dissolved in 99 g of DMF. After removing the solution oxygen by air bubbling, the solution was heated at 70° C. for 8 hours. After cooling to room temperature, a white polymer was precipitated with water. The resulting polymer was dried in vacuum at 25° C. for 24 hours. It had an acid number of 56.3 mg KOH/g.

Synthesis Example 6

Copolymer of MAT/MMA, Molar Ratio=24:76

MAT (13.7 g), MMA (30.4 g), and AIBN (0.4 g) were dissolved in 103 g of DMF. After removing the oxygen by air bubbling, the solution was heated at 70° C. for 8 hours. After cooling to room temperature, a white polymer was precipitated with water. The resulting polymer was dried in vacuum at 25° C. for 24 hours. It had an acid number of 106 mg KOH/g.

Synthesis Example 7

Comparative Copolymer of MAA/MMA, Molar Ratio=13:87

MAA (2.5 g), MMA (19.6 g), and AIBN (0.6 g) were dissolved in 60 g of propylene glycol monomethylether. After removing the oxygen by air bubbling, the solution was heated at 70° C. for 8 hours. After cooling to room temperature, a white polymer was precipitated with water. The resulting polymer was dried in vacuum at 25° C. for 24 hours. It had an acid number of 74 mg KOH/g.

Synthesis of Copolymers C, D, and E:

TABLE II

| Copolymer | MAT | N-PMI | MAS | UMA |
|---|---|---|---|---|
| C | 13.64 g | 24.24 g | 0 | 38.32 g |
| D | 11.06 g | 27.42 g | 0 | 38.32 g |
| E | 9.41 g | 21.36 g | 4.02 g | 38.32 g |

Copolymers C, D, and E were synthesized by placing the monomers in a solvent mixture of 200 g of dioxolane, 50 g of water, and 100 g of ethanol solvent as given in TABLE II above in a 500-ml four-necked round bottom flask equipped with a condenser, a nitrogen supply, a thermometer, a stirrer, and a heating mantle. Nitrogen was bubbled through the solution while the temperature is raised to 75° C. AIBN (1.2 g) was added to the reaction mixture and after 1 hour three further additions of 0.4 g AIBN were made at one-hour intervals as the temperature of the reaction mixture was maintained at 75° C. After an additional one-hour period, the reaction mixture was allowed to cool. The resulting copolymers were isolated by precipitation in 2.6 liters of water to which 1 ml of HCl (30 wt. %) had been added. The resulting precipitate was filtered, washed with 0.5 liter of water, and filtered again. The copolymers were dried to constant weight in a fluid bed dryer at 40° C. The yield of each copolymer was about 95%. The molar ratios of the resulting copolymers are shown in the following TABLE III.

TABLE III

|  | Copolymer C | Copolymer D | Copolymer E | Copolymer A | Copolymer B |
|---|---|---|---|---|---|
| MAM |  |  |  | 37.5 | 20 |
| MAT | 29 | 24 | 20 | 0 | 0 |
| N-PMI | 42 | 48 | 37 | 42 | 37 |
| MAS | 0 | 0 | 14 | 21 | 14 |
| UMA | 29 | 29 | 29 | 0 | 29 |
| Theoretical AN | 94.9 | 76.1 | 117* | 96.5 | 52 |

*sum of tetrazole and COOH groups

Copolymer F was similarly prepared using the following components:

|  | MAT | MMA |
|---|---|---|
| Copolymer F: Theoretical acid no. of 64 | 5.65 g | 29.36 g |
| Copolymer F: Mole ratio | 12 | 88 |

A 250 ml 3-neck round bottomed flask fitted with stirring, temperature monitoring, reflux and nitrogen purging was set up in a thermostatic water bath. To the flask containing the solvents, the monomers were added and heated to 75° C. while flushing with nitrogen. Reaction was initiated by adding 0.19 g of the initiator AIBN. After 1 hour of reaction time, another 0.19 g of AIBN was added. After a further reaction time of 4 hours, the solution was allowed to cool down. The resulting polymer was isolated by precipitating in water and dried at 40° C. overnight to give a yield of 84%.

Invention Examples 1 to 5 and Comparative Example 1

Negative-Working Imageable Elements

Samples of Substrate A were coated with the radiation-sensitive composition described in TABLE IV after filtering. The coated compositions were dried for 4 minutes at 90° C. to provide negative-working imageable layers at a 1.6 g/m² dry coating coverage. The coated layers were overcoated (2 g/m² dry coverage) with an aqueous solution of poly(vinyl alcohol) (Celvol 203 obtained from Air Products, having a hydrolysis degree of 88%) to provide negative-working printing plate precursors having the dry coating weights summarized in TABLE V after drying for 4 minutes at 90° C.

The printing plate precursors, sensitized for 405 nm, were exposed with an image-setter (Andromeda® A750M from Lithotech), equipped with a laser diode emitting at 405 nm (P=30 mW). An UGRA gray scale V2.4 with defined tonal values (all data were linearized in order to approximately obtain the desired tonal value) was imaged onto the precursors described above. The sensitivity of the printing plate precursors was determined using an UGRA Offset test scale 1982 with overall exposure. The imaged elements were heated at 90° C. for 2 minutes, the overcoat layers were washed off with water, and development was carried out using Developer D1 in a processor having two brushes in the developing section and a dwell time for the developing steps of 20 seconds. After development, the resulting printing plates were rinsed with water, gummed with Gum 850 S from Eastman Kodak Company, and dried. The developing time was measured by dipping a strip of the imaged element into the developer and measuring the time necessary for removing the imageable layer coating without mechanical support.

The DAA and BC soak losses were measured by soaking the exposed and ungummed plate in a mixture of 80% of the corresponding solvent plus 20% water for 60 minutes at room temperature, and calculating the weight loss of the plate relative to the non-soaked plate. This soak loss is a measure of stability of the printing plate against attack by the cleaner used in UV ink printing.

To determine the run length, each printing plate was loaded in a sheet-fed offset printing machine using abrasive ink (Offset S 7184 that available from Sun Chemical, which contains 10% of calcium carbonate). The image free areas were checked for toning. The number of copies before a solid area showed a sign of wear corresponds to the run length.

TABLE V below shows that printing plate precursors containing polymers according to the present invention (having pendant 1H-tetrazole groups) exhibit higher photospeed, better developability, lower soak loss in DAA and BC water mixtures, and greater run length compared to imageable elements containing polymers having carboxylic acid groups.

TABLE IV

| | |
|---|---|
| 1.81 g | Polymeric binder corresponding to TABLE III |
| 1.31 g | Dispersion in propylene glycol monomethyl ether containing 21.15 wt. % of copper phthalocyanine and 2.35 wt. % of a poly(vinyl acetal) binder containing 39.9 mol % vinyl alcohol, 1.2 mol % vinyl acetate, 15.4 mol % acetal groups from acetaldehyde, 36.1 mol % acetal groups from butyraldehyde, and 7.4 acetal groups from 4-formylbenzoic acid |
| 0.08 g | Kayamer PM-2 |
| 11 g | Solution of 30 weight % in methyl ethyl ketone of an oligomer made by reaction of HMDI + HEMA + HEPi |
| 0.6 g | NK Ester BPE-500 |
| 1.12 g | 2-Phenyl-4-(2-chlorophenyl)-5-(4-diethylaminophenyl)-oxazole |
| 0.27 g | 2,2-Bis-(2-chlorophenyl)-4,5,4',5'-tetraphenyl-2'H-[1,2']biimidazolyl |
| 0.5 g | Mercapto-3-triazole |
| 36 ml | Propylene glycol monomethyl ether |
| 24 ml | Methanol |
| 29 ml | Methyl ethyl ketone |

TABLE V

| | Polymeric Binder | Photospeed (number of solid and tail steps) | Developing time | Soak losses in DAA and BC | Run Length |
|---|---|---|---|---|---|
| Invention Example 1 | Synthesis Example 2 | 3/10 | 8 seconds | 19%/18% | 170,000 copies |
| Invention Example 2 | Synthesis Example 3 | 3/9 | 5 seconds | 27%/15% | 160,000 copies |
| Invention Example 3 | Synthesis Example 4 | 3/9 | 5 seconds | 19%/17% | 140,000 copies |
| Invention Example 4 | Synthesis Example 5 | 3/8 | 5 seconds | 26%/17% | 160,000 copies |
| Invention Example 5 | Synthesis Example 6 | 2/10 | 5 seconds | 22%/23% | 160,000 copies |
| Comparative Example 1 | Synthesis Example 7 | 2/6 | 10 seconds | 44%/33% | 110,000 copies |

Invention Examples 6-8 and Comparative Examples 2-3

Positive-Working, Multi-Layer Imageable Elements

Positive-working lithographic printing plates were prepared as follows:

Bottom (Inner) Layer 1:

A coating formulation was prepared by dissolving 2.06 g of Copolymer A, 0.38 g of IR Dye A, 0.038 g of Dye D11, and 0.038 g of Byk® 307 in 37.5 g of the solvent mixture comprising MEK:Dowanol® PMA:BLO:$H_2O$ (35/45/10/10 wt. ratio) and it was coated onto Substrate A and dried at 135° C. for 45 seconds to provide a dry coating weight of 1.35 g/m².

Bottom (Inner) Layer 2:

A coating formulation was prepared by dissolving 2.06 g of Copolymer B, 0.38 g of IR Dye A, 0.038 g of Dye D11, and 0.038 g of Byk® 307 in 37.5 g of the solvent mixture MEK: Dowanol® PMA:BLO:$H_2O$ (35/35/15/15 wt. ratio) and it was coated onto Substrate A and dried at 135° C. for 45 seconds to provide a dry coating weight of 1.35 g/m².

Bottom (Inner) Layer 3:

The coating formulation was obtained by dissolving 2.06 g of Copolymer C, 0.38 g of IR Dye A, 0.038 g of Dye D11, and 0.038 g Byk® 307 in 37.5 g of a solvent mixture of 1,3-dioxolane:methanol:BLO:$H_2O$ (60/20/10/10 wt. ratio) and it was coated onto Substrate A and dried at 135° C. for 45 seconds to provide a dry coating weight of 1.35 g/m².

Bottom (Inner) Layer 4:

This layer was prepared as described for Bottom (Inner) Layer 3 except that Copolymer C was replaced with Copolymer D.

Bottom (Inner) Layer 5:

This layer was prepared as described for Bottom (Inner) Layer 3 except that Copolymer C was replaced with Copolymer E.

Top (Outer) Layer 1:

A coating formulation was made by dissolving 2.38 g of TN13, 0.032 g of Ethyl Violet and 0.030 g of Byk® 307 in 40 g of a solvent mixture of diethylketone and Dowanol® PMA (92:8 wt. ratio). The formulation was coated over the various bottom (inner) layers as indicated in TABLE VI below and dried at 135° C. for 45 seconds to provide a top layer coating weight of approximately 0.65 g/m².

Top (Outer) Layer 2:

Another coating formulation was made by substituting TN13 with PD 494 in the Top (Outer) Layer 1 formulation.

Top (Outer) Layer 3:

Still another coating formulation was made by dissolving 2.38 g of SMA1000, 0.032 g of Ethyl Violet and 0.030 g of Byk® 307 in 40 g of a solvent mixture of diethylketone and Dowanol® PMA (92:8 weight ratio).

The resulting multi-layer positive-working lithographic printing plate precursors were prepared as described in TABLE VI below. Imaging was carried out using a Kodak Trendsetter Quantum imagesetter at 830 nm and development was carried out as described in TABLE VI below. "G+J Processor" refers to a commercial Glunz&Jensen processor. Various results are also shown in TABLE VI.

TABLE VI

| Bottom layer | Bottom Layer Polymeric Binder | Top Layer & Polymeric Binder | Developer | Processing speed | Clear Point |
|---|---|---|---|---|---|
| 1 | Copolymer A Comparative Example 1 | 3 SMA1000 | 980 Developer | 1200 mm/min. G + J Processor | 86 mJ/cm² |
| 2 | Copolymer B Comparative Example 2 | 3 SMA1000 | 956 Developer | 20 second-hand development | 83 mJ/cm² |
| 3 | Copolymer C | 1 TN13 | Goldstar ® Premium | 750 mm/min Mercury 850 Processor | 92 mJ/cm² |
| 4 | Copolymer C | 3 SMA1000 | 980 Developer | 1200 mm/min G + J Processor | 83 mJ/cm² |
| 5 | Copolymer C | 3 SMA1000 | LP-DS Fuji | 1200 mm/min G + J Processor | 83 mJ/cm² |
| 6 | Copolymer D | 3 SMA1000 | 956 Developer | 20 second-hand development | 83 mJ/cm² |
| 7 | Copolymer C | 2 PD494 | Goldstar ® Premium | 1000 mm/min Mercury 850 Processor | 75 mJ/cm² |

Clear Point:

The clear point in each case was determined by imaging a power series at 360 rpm starting at 4 W in steps of 1 Watt, and developing with the respective developers at 23° C. in a Mercury processor at 1000 mm/min. The minimum energy required to give a clean background is noted above in TABLE VI.

Resolution:

The resolution was evaluated by looking at the 1 and 2 pixel lines under a microscope with 100× magnification at the regular exposure energy at 30% above the clear point energy. All of the printing plates, Invention and Comparative, showed excellent resolution under the regular exposure.

Solvent Resistance:

The solvent resistance was determined by measuring the gravimetric soak loss of the bottom layer coated plates after 5 minutes in the following solvent/water 80:20 mixtures of aggressive press room solvents: butyl cellosolve (BC), dipropylene glycol monomethyl ether (DGME), and diacetone alcohol (DAA). The percentage losses after 5 minutes are recorded in TABLE VII.

TABLE VII

| Bottom layer | | BC/$H_2O$ | DGME/$H_2O$ | DAA/$H_2O$ |
|---|---|---|---|---|
| 1 | Copolymer A (Comparative Example 2) | 17% | 67% | 82% |

TABLE VII-continued

| Bottom layer | | BC/H$_2$O | DGME/H$_2$O | DAA/H$_2$O |
|---|---|---|---|---|
| 2 | Copolymer B (Comparative Example 3) | 12% | 11% | 66% |
| 3 | Copolymer C (Invention Example 6) | 19% | 9% | 33% |
| 4 | Copolymer D (Invention Example 7) | 20% | 13% | 33% |
| 5 | Copolymer E (Invention Example 8) | 13% | 19% | 84% |

These examples demonstrate that the use of the polymers having the 1H-tetrazole groups in place of polymers having carboxylic groups provide good developability of imaged multi-layer positive-working elements in alkaline developers as well as improved solvent resistance.

Invention Example 9 and Comparative Example 4

Positive-Working, Single Layer Imageable Elements

Comparative Example 4 was prepared as described in Comparative Example 2 of EP 1,747,900A1 (Hauck et al.). The imageable layer components were dissolved in Dowanol® PM/MEK (80/20 wt. ratio) to a 10 w/w % solution. The coating formulation was coated onto Substrate A and dried at 105° C. for 90 seconds to provide a dry coating weight of 1.50 g/m$^2$. The resulting printing plate precursor was conditioned (standard conditioning process includes use of interleaving paper with 5% water and water proof wrapping) at 55° C. for 3 days.

A solvent mixture was prepared with 1,3-dioxolane/methanol/γ-butyrolactone/water (60/20/10/10 wt. ratio) and was used to dissolve the imageable layer components. The Invention Example 9 imageable element was prepared like Comparative Example 4 except that Copolymer C was used in place of PD494 novolak (23.5 w/w %).

Evaluation of the Elements:

The two positive-working imageable elements were imaged with test patterns ("plots" having 50% areas) at 10.5 W and varied drum speeds corresponding to 98 to 175 mJ/cm$^2$ in 5 exposure steps (98, 110, 126, 147, 176) using a Kodak Quantum 800 imagesetter. The imaged elements were then processed in a Mercury processor at 1000 mm/min (dwell time about 30 seconds) at 23° C. using Goldstar Premium Developer.

The linear speed was derived by visual evaluation of above 50% tonal value areas made up from lines and gaps of 10, 20 and 40 μm. The energy at which these areas showed the same optical density ("visual melting") is given in the TABLE VIII below.

The solvent resistance was tested by immersing a strip of the unimaged element, 5 cm×20 cm, in a solvent mixture made up of petroleum ether/isopropanol/water (79/20/1 weight ratio). At every 30 second interval up to 4 minutes, the elements were rubbed with a tissue so that the rubbed areas had varying dwell times in the solvent mixture. The elements were then taken out and rinsed with water. The time at which the first visible attack was evident is noted in TABLE VIII.

TABLE VIII

| | Solvent resistance (minutes) | Dot reproduction (μm) | Linear speed (mJ/cm$^2$) |
|---|---|---|---|
| Comparative Example 4 | <0.5 | 10 | 150 |
| Invention Example 9 | 4 | 10 | 150 |

The results in TABLE VIII show that single-layer positive-working imageable elements can be obtained using the polymers described herein containing 1H-tetrazole groups. The resulting printing plate precursors exhibit good imaging characteristics and much improved solvent resistance compared to similar precursors having various known phenolic polymers.

Invention Examples 10-11 and Comparative Example 5

Positive-Working, Multi-Layer Imageable Elements

Positive-working, multi-layer imageable elements were prepared in the following manner:

Bottom (Inner) Layer 6:

A coating formulation was prepared by dissolving 2.06 g of Copolymer G, 0.038 g of D11, and 0.038 g of Byk® 307 in 37.5 g of a solvent mixture comprising MEK:Dowanol® PM:BLO:H$_2$O 35/45/10/10 wt. ratio, coating it onto Substrate A, and drying at 135° C. for 45 seconds to provide a dry coating weight of 1.35 g/m$^2$.

Bottom (Inner) Layer 3 (Described Above):

For Invention Example 10, Copolymer F (2.4 g), 0.012 g of Byk® 307 and 0.013 g of Ethyl Violet were dissolved in 20 g of a solvent mixture (diethyl ketone: Dowanol® PMA: isopropyl alcohol at 8:1:1 weight ratio), coated over Bottom (Inner) Layer 6, and dried to give a coating weight of 0.65 g/m$^2$.

For Invention Example 11, the top (outer) layer formulation described for Example 10 was coated over Bottom (inner) Layer 3 and dried to give a coating weight of 0.65 g/m$^2$.

For Comparative Example 5, a formulation for a top (outer) layer was prepared by dissolving 4.8 g of PD140A, 2.1 g of P3000, 0.03 g of Ethyl Violet, and 0.04 g of Byk® 307 in 100 ml of diethyl ketone. This formulation was coated over the bottom (inner) layer 1 and dried to give a coating weight of 0.65 g/m$^2$.

The imageable elements were imaged with test patterns at 9 W and drum speeds between 150 rpm and 360 rpm in steps of 30 rpm with a Creo Quantum 800 (67-161 mJ/cm$^2$). The imaged elements were developed with 956 Developer (Eastman Kodak Company) in a Mercury processor at 900 mm/min. to give a good image with excellent resolution and clean background at exposures above 92 mJ/cm$^2$ with Invention Example 10 and above 75 mJ/cm$^2$ with Invention Example 11. Comparative Example 5 was Similarly Developed to Give a Good Image with Excellent Resolution and Clean Background at Exposures Above 92 mJ/cm$^2$ The solubility of Copolymer F in 956 Developer was tested by stirring 0.3 g of the polymer in 30 ml of 956 Developer. The resin dissolved completely without any residues.

The solubility of the resin components PD140A and P3000 in 980 Developer was evaluated by individually stirring 0.2 g of PD140 A and 0.1 g of P3000 in 30 ml of the developer. Insoluble residues were found in the developer. This shows that the top (outer) layer compositions containing such polymer binders can lead to filter blockage and re-deposition problems in the processor.

The solvent resistance to commonly used press room chemicals, butyl cellosolve (BC) and dipropylene glycol monomethyl ether (DGME) was evaluated for Copolymer F and the top (outer) layer polymers (PD 140A and P3000) used in Comparative Example 5 by coating the polymer resin(s) from each example onto Substrate A and placing drops of each solvent at 30 second intervals and wiping off the solvents after 3 minutes. While Copolymer F was not removed after 3 minutes, the resins used in the top (outer) layer of Comparative Example 5 were removed within 30 seconds.

The invention has been described in detail with particular reference to certain preferred embodiments thereof, but it will be understood that variations and modifications can be effected within the spirit and scope of the invention.

The invention claimed is:

1. An imageable element that is a lithographic printing plate precursor comprising a substrate having thereon an imageable layer that includes a water-insoluble and alkaline solution-soluble component that has 1H-tetrazole groups, wherein the component is either a non-polymeric radically polymerizable compound or a polymer having the pendant 1H-tetrazole groups,
   provided that when said component is a phenolic polymer having 1H-tetrazole groups attached thereto, such attachment is provided without a thio linking group.

2. The element of claim 1 wherein said component is a polymer having a backbone to which said 1H-tetrazole groups are attached, and said polymer is soluble in an alkaline developer having a pH equal to or less than 13.5.

3. The element of claim 2 wherein said polymer is present in said imageable layer in an amount of at least 5% and up to and including 95% based on the total imageable layer dry weight.

4. The element of claim 1 wherein said 1H-tetrazole is connected at its 5-position to a nitrogen atom.

5. The element of claim 2 wherein said 1H-tetrazole groups are present in said polymer sufficient to provide at least 50 mol % of all acidic groups present in said polymer.

6. The element of claim 1 that is a negative-working element having a spectral sensitivity of from about 250 to about 700 nm and said component having 1H-tetrazole groups is a polymer having pendant 1H-tetrazole groups, said polymer optionally also having radically polymerizable reactive side groups.

7. The element of claim 1 that is a negative-working element that has a spectral sensitivity of from about 700 to about 1250 nm.

8. The element of claim 1 that is a negative-working imageable element in which said imageable layer comprises:
   a radically polymerizable component,
   an initiator composition capable of generating free radicals sufficient to initiate polymerization of free radically polymerizable groups upon exposure to imaging radiation,
   a radiation absorbing compound, and
   a polymer having a backbone to which are attached pendant 1H-tetrazole groups in sufficient amount such that, only prior to exposure to imaging radiation, said imageable layer is soluble in a developer having a pH less than 13.5.

9. The element of claim 8 wherein said polymer is represented by the following Structure (I):

$$-(A)_x-(B)_y- \quad (I)$$

wherein A represents recurring units comprising said 1H-tetrazole groups, B represents recurring units not containing 1H-tetrazole groups, x is from about 3 to 100 mol %, and y is from 0 to about 97 mol %.

10. The element of claim 9 wherein x is from about 3 to about 90 mol %, y is from about 10 to about 97 mol %, and B represent recurring units derived from one or more (meth)acrylates, (meth)acrylamides, (meth)acrylonitriles, styrene or styrene derivatives, vinyl acetate, vinyl pyrrolidone, vinyl alcohol, maleimide, or half esters of ring-opened maleic acid anhydrides.

11. The element of claim 9 wherein x is from about 3 to about 90 mol %, y is from about 10 to about 97 mol %, A represents recurring units comprising carbon-carbon backbone derived from one or more ethylenically unsaturated polymerizable monomers, and said 1H-tetrazole groups are attached to said backbone through a linking group L comprising a $-C(=O)-NR^1-$, $-NR^1-$, $-NR^1-(C=O)-NR^2-$, $-S-$, $-OCO(=O)-$, or $-CH=N-$ group, or a combination thereof, and $R^1$ and $R^2$ are independently hydrogen or alkyl, aryl, or cycloalkyl groups.

12. The element of claim 1 that is a positive-working imageable element comprising at least one imageable layer comprising a polymer having a backbone and said pendant 1H-tetrazole groups attached thereto.

13. The element of claim 12 wherein said polymer is represented by the following Structure (I):

$$-(A)_x-(B)_y- \quad (I)$$

wherein A represents recurring units comprising said 1H-tetrazole groups, B represents recurring units not containing 1H-tetrazole groups, x is from about 3 to 100 mol %, and y is from 0 to about 97 mol %.

14. The element of claim 13 wherein x is from about 3 to about 97 mol %, y is from about 3 to about 97 mol %,
   A represents recurring units comprising carbon-carbon backbone derived from one or more ethylenically unsaturated polymerizable monomers, and said 1H-tetrazole groups are attached to said backbone through a linking group L comprising a $-C(=O)-NR^1-$, $-NR^1-$, $-NR^1-(C=O)-NR^2-$, $-S-$, $-OCO(=O)-$, or $-CH=N-$ group, or a combination thereof, and $R^1$ and $R^2$ are independently hydrogen or alkyl, aryl, or cycloalkyl groups, and
   B represent recurring units derived from one or more (meth)acrylates, (meth)acrylamides, (meth)acrylonitriles, styrene or styrene derivatives, vinyl acetate, vinyl pyrrolidone, vinyl alcohol, maleimide, or half esters of ring-opened maleic acid anhydrides.

15. The element of claim 12 comprising an inner imageable layer and an outer imageable layer disposed on said inner imageable layer, wherein said polymer having said pendant 1H-tetrazole groups is dispersed within either or both of said inner and outer imageable layers.

16. The element of claim 12 that has a spectral sensitivity of from about 750 to about 1250 nm and comprises an infrared radiation dye.

17. The element of claim 1 wherein said substrate is an aluminum-containing substrate having a hydrophilic surface upon which said imageable layer is disposed.

18. A method comprising:
   A) imagewise exposing the imageable element of claim 1 to produce exposed and non-exposed regions, and
   B) with or without a post-exposure preheat step, developing said imagewise exposed element with an aqueous alkaline solution having a pH equal to or less than 13.5.

19. The method of claim 18 wherein the post-exposure preheat step is omitted and predominantly only said non-exposed regions are removed by said developing to provide a negative-working lithographic printing plate having a hydrophilic aluminum-containing substrate.

20. The method of claim 18 wherein said imageable element has a spectral sensitivity to imagewise exposure that is carried out at a wavelength of from about 250 to about 450 nm, or to imagewise exposure that is carried out at a wavelength of from about 750 to about 1250 nm.

21. The method of claim 18 wherein predominantly only said exposed regions are removed during said developing to provide a positive-working lithographic printing plate having a hydrophilic aluminum-containing substrate.

22. The method of claim 18 wherein said imageable element comprises a polymer that is present in said imageable layer in an amount of at least 5% and up to and including 95% based on the total imageable layer dry weight, and is represented by the following Structure (I):

-(A)$_x$-(B)$_y$-            (I)

wherein x is from about 3 to about 97 mol %, y is from about 3 to about 97 mol %, A represents recurring units comprising carbon-carbon backbone derived from one or more ethylenically unsaturated polymerizable monomers, and said 1H-tetrazole groups are attached to said backbone through a linking group L comprising a —C(=O)—NR$^1$—, —NR$^1$—, —NR$^1$—(C=O)—NR$^2$—, —S—, —OCO(=O)—, or —CH=N— group, or a combination thereof, and R$^1$ and R$^2$ are independently hydrogen or alkyl, aryl, or cycloalkyl groups, and B represent recurring units derived from one or more (meth)acrylates, (meth)acrylamides, (meth)acrylonitriles, styrene or styrene derivatives, vinyl acetate, vinyl pyrrolidone, vinyl alcohol, maleimide, or half esters of ring-opened maleic acid anhydrides.

23. A negative-working radiation-sensitive composition comprising:

a radically polymerizable component, an initiator composition capable of generating free radicals sufficient to initiate polymerization of free radically polymerizable groups upon exposure to imaging radiation, a radiation absorbing compound, and a component having 1H-tetrazole groups, which component is:

a) said radically polymerizable component, b) a water-insoluble polymer having pendant 1H-tetrazole groups attached to a backbone in sufficient amount such that, prior to exposure to imaging radiation, the polymer is soluble in a developer having a pH equal to or less than 13.5, or c) both.

24. The composition of claim 23 that has a spectral sensitivity of from about 250 to about 450 nm or from about 750 to about 1250 nm.

* * * * *